US012707844B2

(12) United States Patent
Zeng et al.

(10) Patent No.: US 12,707,844 B2
(45) **Date of Patent: *Aug. 11, 2026**

(54) DISPLAY SUBSTRATE AND PREPARATION METHOD THEREOF, AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Chao Zeng, Beijing (CN); Weiyun Huang, Beijing (CN); Youngyik Ko, Beijing (CN)

(73) Assignees: Chengdu BOE Optoelectronics Technology Co., Ltd., Chengdu (CN); BOE Technology Group Co., Ltd., Beijing (CN)

(*) Notice: Subject to any disclaimer, the term of this patent is extended or adjusted under 35 U.S.C. 154(b) by 0 days.

This patent is subject to a terminal disclaimer.

(21) Appl. No.: 19/097,873

(22) Filed: Apr. 2, 2025

(65) Prior Publication Data

US 2025/0234736 A1 Jul. 17, 2025

Related U.S. Application Data

(63) Continuation of application No. 18/614,777, filed on Mar. 25, 2024, now Pat. No. 12,302,725, which is a continuation of application No. 17/292,011, filed as application No. PCT/CN2020/105788 on Jul. 30, 2020, now Pat. No. 11,997,903.

(51) Int. Cl.
*G09G 3/3225* (2016.01)
*H10K 59/131* (2023.01)

(52) U.S. Cl.
CPC ....... *H10K 59/1315* (2023.02); *G09G 3/3225* (2013.01); *G09G 2310/0281* (2013.01)

(58) Field of Classification Search
None
See application file for complete search history.

(56) References Cited

U.S. PATENT DOCUMENTS

2016/0111040 A1* 4/2016 Kim ....................... H10D 86/60 257/773
2017/0212624 A1* 7/2017 Katsuta ................. G06F 3/0446
2018/0129111 A1* 5/2018 Wu ........................ H10D 86/60
2019/0140036 A1* 5/2019 Hyeon ................. H10K 77/111
2019/0181213 A1* 6/2019 Lim ..................... G09G 3/3225

* cited by examiner

*Primary Examiner* — Krishna P Neupane

(57) ABSTRACT

Provided are a display substrate and a preparation method thereof, and a display apparatus. The display substrate includes a display region and a binding region located on one side of the display region. The binding region includes: a source driver circuit, a flexible printed circuit board, a first selector circuit, a second selector circuit and a plurality of selection connection lines. For at least one selection connection line of the plurality of selection connection lines, one end of the selection connection line is connected to an input port of the first selector circuit, and the other end is connected to an input port of the second selector circuit. The flexible printed circuit board is disposed on one side, away from the display region, of the source driver circuit, and the plurality of selection connection lines are arranged between the source driving circuit and the flexible printed circuit board.

19 Claims, 8 Drawing Sheets

DISPLAY SUBSTRATE AND PREPARATION METHOD THEREOF, AND DISPLAY APPARATUS

CROSS-REFERENCE TO RELATED APPLICATION(S)

This application is a continuation of U.S. patent application Ser. No. 18/614,777 filed on Mar. 25, 2024, which is a continuation of U.S. patent application Ser. No. 17/292,011 filed on May 7, 2021, which is a U.S. National Phase Entry of International PCT Application No. PCT/CN2020/105788 having an international filing date of Jul. 30, 2020. The above-identified applications are incorporated by reference herein in their entireties.

TECHNICAL FIELD

The present disclosure relates to, but is not limited to, the field of display technology, in particular to a display substrate and a preparation method thereof, and a display apparatus.

BACKGROUND

An organic light emitting diode (OLED) is an active light emitting display apparatus, which has advantages of self-emission, wide view, high contrast, low power consumption, and extremely high response speed, etc. With the continuous development of display technology, a flexible display apparatus with an OLED as a light emitting device and a thin film transistor (TFT) for signal control has become a mainstream product in the display field.

SUMMARY

The following is a summary of the subject matter described in detail herein. This summary is not intended to limit the protection scope of the claims.

On the one hand, an exemplary embodiment of the present disclosure provides a display substrate, including a display region and a binding region located on one side of the display region. The binding region includes: a source driver circuit, a flexible printed circuit board, a first selector circuit, a second selector circuit, and a plurality of selection connection lines. For at least one selection connection line of the plurality of selection connection lines, one end of the selection connection line is connected to an input port of the first selector circuit, and the other end is connected to an input port of the second selector circuit. The flexible printed circuit board is disposed on one side, away from the display region, of the source driver circuit, and the plurality of selection connection lines are disposed between the source driver circuit and the flexible printed circuit board.

In an exemplary embodiment, the first selector circuit and the second selector circuit are respectively disposed on both sides of the source driver circuit in a direction parallel to an edge of the display region; the edge of the display region is an edge of the display region adjacent to one side of the binding region.

In an exemplary embodiment, a plurality of selector pins are disposed on the flexible printed circuit board, and the selector pins are disposed on both sides of the flexible printed circuit board along the direction parallel to the edge of the display region. For at least one selector pin among the plurality of selector pins, the selector pin is connected with the selection connection line through a selection trace, or is connected with an input port of the first selector circuit or that of the second selector circuit through a selection trace.

In an exemplary embodiment, in a plane perpendicular to the display substrate, the binding region includes: a binding structure layer deposited on the substrate; a composite insulating layer disposed on the binding structure layer; a plurality of selection connection lines disposed on the composite insulating layer.

In an exemplary embodiment, the binding structure layer includes: a first insulating layer and a second insulating layer disposed on the substrate; a first signal connection line disposed on the second insulating layer; a third insulating layer and a fourth insulating layer covering the first signal connection line and provided with two first vias exposing the first signal connection line; and a driver chip signal line and a circuit board signal line disposed on the fourth insulating layer, wherein one end of the driver chip signal line is connected with the source driver circuit, and the other end of the driver chip signal line is connected with a first end of the first signal connection line through the first via; one end of the circuit board signal line is connected with the flexible printed circuit board, and the other end of the circuit board signal line is connected with a second end of the first signal connection line through the first via.

In an exemplary embodiment, the binding structure layer includes: a first insulating layer, a second insulating layer and a third insulating layer disposed on the substrate; a second signal connection line disposed on the third insulating layer; a fourth insulating layer covering the second signal connection line and provided with two second vias exposing the second signal connection line; and a driver chip signal line and a circuit board signal line disposed on the fourth insulating layer, wherein one end of the driver chip signal line is connected with the source driver circuit, and the other end of the driver chip signal line is connected with a first end of the second signal connection line through the second via; one end of the circuit board signal line is connected with the flexible printed circuit board, and the other end of the circuit board signal line is connected with a second end of the second signal connection line through the second via.

In an exemplary embodiment, the binding structure layer includes: a first insulating layer and a second insulating layer disposed on the substrate; a first signal connection line disposed on the second insulating layer; a third insulating layer covering the first signal connection line; a second signal connection line disposed on the third insulating layer; a fourth insulating layer covering the second signal connection line and provided with two first vias exposing the first signal connection line and two second vias exposing the second signal connection line; and a driver chip signal line and a circuit board signal line disposed on the fourth insulating layer, wherein one end of the driver chip signal line is connected with the source driver circuit, and the other end of the driver chip signal line is connected with first ends of the first signal connection line and the second connection line through the first via and the second via; one end of the circuit board signal line is connected with the flexible printed circuit board, and the other end of the circuit board signal line is connected with second ends of the first signal connection line and the second signal connection line through the first via and the second via.

In an exemplary embodiment, the composite insulating layer is further provided with at least two shielding lines. The at least two shielding lines are respectively disposed on one side adjacent to the display region and one side away from the display region of the plurality of selection connection lines, and along the direction away from the display region, the width of the orthographic projection of the shielding line on the substrate is greater than that of the orthographic projection of the selection connection line on the substrate.

In an exemplary embodiment, the fourth insulating layer is further provided with a shielding panel. The shielding panel is disposed between the driver chip signal line and the circuit board signal line, and along the direction away from the display region, the boundary of the orthographic projection of the plurality of selection connection lines on the substrate is located within the boundary range of the orthographic projection of the shielding panel on the substrate.

In an exemplary embodiment, in a plane perpendicular to the display substrate, the display region includes: a first insulating layer, an active layer, a second insulating layer, a first gate metal layer, a third insulating layer, a second gate metal layer, a fourth insulating layer, a first source-drain metal layer, a composite insulating layer and a second source-drain metal layer stacked on the substrate. The first signal connection line is disposed on the same layer as the first gate metal layer; the second signal connection line is disposed on the same layer as the second gate metal layer; the driver chip signal line and the circuit board signal line are disposed on the same layer as the first source-drain metal layer; and the plurality of selection connection lines are disposed on the same layer as the second source-drain metal layer.

In an exemplary embodiment, the driver chip signal line and the circuit board signal line are first power supply lines VDD, or the driver chip signal line and the circuit board signal line are second power supply lines VSS.

In an exemplary embodiment, the binding region includes: a first insulating layer and a second insulating layer disposed on the substrate; a first selection connection line and at least two first shielding lines disposed on the second insulating layer, wherein the at least two first shielding lines are respectively disposed on both sides of the plurality of first selection connection lines; a third insulating layer covering the first selection connection line and the at least two first shielding lines; a second selection connection line and at least two second shielding lines disposed on the third insulating layer, wherein the at least two second shielding lines are respectively disposed on both sides of the plurality of second selection connection lines; a fourth insulating layer covering the second selection connection line and at least two second shielding lines; a shielding panel disposed on the fourth insulating layer, wherein the boundary of the orthographic projection of the plurality of first selection connection lines or the plurality of second selection connection lines on the substrate is located within the boundary range of the orthographic projection of the shielding panel on the substrate; a composite insulating layer disposed on the shielding panel; and a plurality of third signal connection lines disposed on the composite insulating layer.

In an exemplary embodiment, in a plane perpendicular to the display substrate, the display region includes: a first insulating layer, an active layer, a second insulating layer, a first gate metal layer, a third insulating layer, a second gate metal layer, a fourth insulating layer, a first source-drain metal layer, a composite insulating layer and a second source-drain metal layer stacked on the substrate. The first selection connection line is disposed on the same layer as the first gate metal layer; the second selection connection line is disposed on the same layer as the second gate metal layer; the shielding panel is disposed on the same layer as the first source-drain metal layer; the third signal connection line is disposed on the same layer as the second source-drain metal layer.

In another aspect, an exemplary embodiment of the present disclosure further provides a display apparatus, including the aforementioned display substrate.

The present disclosure also provides a preparation method of a display substrate, which includes a display region and a binding region located on one side of the display region, and the preparation method includes the following:

forming a source driver circuit, a flexible printed circuit board, a first selector circuit, a second selector circuit, and a plurality of selection connection lines in the binding region; for at least one selection connection line of the plurality of selection connection lines, one end of the selection connection line is connected to an input port of the first selector circuit, and the other end is connected to an input port of the second selector circuit; the flexible printed circuit board is disposed on one side, away from the display region, of the source driver circuit, and the plurality of selection connection lines are disposed between the source driver circuit and the flexible printed circuit board.

Other aspects will become apparent upon reading and understanding the accompanying drawings and the detailed description.

BRIEF DESCRIPTION OF THE DRAWINGS

Accompanying drawings are used to provide a further understanding of technical solutions of the present disclosure, form a part of the specification, and explain technical solutions of the present disclosure together with embodiments of the present disclosure, while they do not constitute a limitation on the technical solutions of the present disclosure. Shapes and sizes of the components in the drawings do not reflect true proportions, and the purpose is only for schematically describing contents of the present disclosure.

Figure 1:
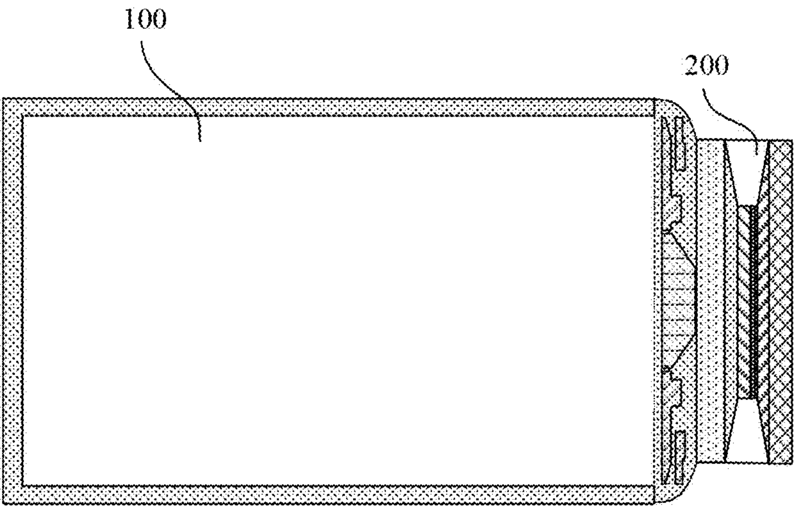
FIG. 1 is a schematic structural diagram of a display substrate according to an exemplary embodiment of the present disclosure.

| Illustration of reference signs: |
|---|
| 1—Glass Carrier Plate; |
| 10—Base Substrate, |
| 11—First Insulating Layer; |
| 12—Second Insulating Layer; |
| 13—Third Insulating Layer; |
| 14—Fourth Insulating Layer; |
| 15—Fifth Insulating Layer; |
| 16—First Planarization Layer; |
| 17—Second Planarization Layer; |
| 100—Display Region; |
| 101—Thin Film Transistor; |
| 102— Storage Capacitor; |
| 103—Connection Electrode; |
| 110—Edge of Display Region; |
| 200—Binding Region; |
| 201—First Fanout Region; |
| 202—Bending Region; |
| 203—Second Fanout Region; |
| 204—Driver Chip Region; |
| 205—Circuit Board Region; |
| 206—Selection Connection Line Region; |
| 207—Selector Circuit Region; |
| 210—First Selector Circuit; |
| 220—Second Selector Circuit; |
| 230—TSP Trace; |
| 300—Flexible Printed Circuit Board; |
| 301—First Signal Connection Line; |
| 302—Second Signal Connection Line; |
| 303—Shielding Panel; |
| 304—Driver Chip Signal Line; |
| 305—Circuit Board Signal Line; |
| 306—Select Connection Line; |
| 306-1—First Selection Connection Line; |
| 306-2—Second Selection Connection Line; |
| 307—Shielding Line; |
| 308—Third Signal Connection Line; |
| 310—Selector Pin; |
| 320—Selector Trace. |

DETAILED DESCRIPTION

To make the objects, technical solutions and advantages of the present disclosure more clear, embodiments of the present disclosure will be described in detail below with reference to the accompanying drawings. Note, the embodiments may be implemented in a number of different forms. A person of ordinary skills in the art will readily understand the fact that implementations and contents may be transformed into a variety of forms without departing from the spirit and scope of the present disclosure. Therefore, the present disclosure should not be construed as being limited only to what is described in the following embodiments. Without conflict, embodiments in the present disclosure and features in the embodiments may be combined with each other arbitrarily.

In the drawings, the size of each constituent element, or the thickness or region of a layer, is sometimes exaggerated for clarity. Therefore, an implementation of the present disclosure is not necessarily limited to the size shown, and shapes and sizes of the components in the drawings do not reflect true proportions. In addition, the drawings schematically show ideal examples, and an implementation of the present disclosure is not limited to the shapes or values shown in the drawings.

The "first", "second", "third" and other ordinal numbers in the present specification are used to avoid confusion of constituent elements, but not to limit in quantity.

In the present specification, for convenience, words indicating orientation or position relationship such as "middle", "upper", "lower", "front", "rear", "vertical", "horizontal", "top", "bottom", "inside" and "outside" or the like are used to indicate the position relationship of constituent elements with reference to the drawings, and this is only for ease of description of the present specification and simplification of the description, rather than indicating or implying that the referred apparatus or element must have a specific orientation, or be constructed and operated in a particular orientation, and therefore this cannot be understood as a limitation on the present disclosure. The position relationship of the constituent elements is appropriately changed according to the direction in which each constituent element is described. Therefore, it is not limited to the words described in the present specification, and can be replaced as appropriate according to specific situations.

In the present specification, the terms "installed", "connected" and "coupled" shall be broadly understood unless otherwise explicitly specified and defined. For example, it may be fixedly connected, or may be removable connected, or integrally connected; it may be mechanically connected, or may be electrically connected; it may be directly connected, or may be indirectly connected through middleware, or may be internal connection between two elements. For those of ordinary skill in the art, the specific meanings of the above terms in the present disclosure may be understood according to a specific situation.

In the present specification, a transistor refers to an element including at least three terminals, namely a gate electrode, a drain electrode and a source electrode. A transistor has a channel region between a drain electrode (drain terminal, drain region or drain electrode) and a source electrode (source terminal, source region or source electrode), and current can flow through the drain electrode, channel region and source electrode. Note that in the present specification, the channel region refers to a region through which current mainly flows.

In the present description, the first electrode may be a drain electrode and the second electrode may be a source electrode, or the first electrode may be a source electrode and the second electrode may be a drain electrode. The functions of the "source electrode" and the "drain electrode" are sometimes interchanged under the circumstance that transistors with opposite polarities are used or the circumstance that the current direction changes during circuit operation, or other circumstances. Therefore, in the present specification, "source electrode" and "drain electrode" can be interchanged.

In the present specification, “electrical connection” includes a circumstance where the constituent elements are connected together through an element having a certain electrical action. The “element having a certain electrical action” is not particularly limited as long as it can transmit and receive electrical signals between connected constituent elements. Examples of the “element having a certain electrical action” include not only electrodes and wiring, but also switching elements such as transistors, resistors, inductors, capacitors, and other elements with various functions.

In the present specification, “parallel” refers to a state in which two straight lines form an angle of −10 degrees or more and 10 degrees or less, and thus also includes a state in which the angle is −5 degrees or more and 5 degrees or less. In addition, “vertical” refers to a state in which two straight lines form an angle of 80 degrees or more and 100 degrees or less, and thus also includes a state of an angle being 85 degrees or more and 95 degrees or less.

In the present specification, “film” and “layer” can be interchanged. For example, sometimes “conductive layer” can be replaced by “conductive film”. Similarly, “insulating film” can sometimes be replaced by “insulating layer”.

The “about” in the present disclosure means that the limit is not strictly set, and a value within the range of process and measurement errors is allowed.

In an exemplary embodiment, the touch substrate of OLED adopts a flexible multilayer on cell (FMLOC) structure, and the flexible touch substrate is disposed on the packaging layer of OLED display structure. This integrates the display structure with the touch structure, has the advantages of being thin and foldable etc., and can meet the product demands of flexible folding, narrow bezel etc.

In an exemplary embodiment, the OLED includes: a display region, a binding region located on one side of the display region, and an edge region located on the other side of the display region. The display region includes a plurality of light emitting units regularly disposed, and each light emitting unit is connected to at least one gate line and at least one data line. The binding region and the edge region are each provided with a driver circuit, and the driver circuit is configured to provide display signals and touch signals to the display region. In an exemplary embodiment, the driver circuit may include: gate driver on array (GOA) circuits which are disposed on both sides of the display region and configured to provide scanning signals to the display region; a source driver circuit (Driver IC) which is disposed in the binding region and configured to supply data signals to the display region; touch traces which are disposed in the binding region and the edge region and configured to provide touch signals to the touch substrate; and a multiplexer (MUX) circuit which is disposed in the binding region and configured to select TSP traces to reduce the number of TSP traces led out to the touch substrate. The signal lines of the gate driver on array circuit, the signal lines of the source driver circuit, and the signal lines of the selector circuit are connected to an external control device through a flexible printed circuit (FPC) disposed in the binding region. In some possible implementations, the driver circuit may include a touch and display driver integration (TDDI).

An exemplary embodiment of the present disclosure provides a display substrate including a display region and a binding region located on one side of the display region. The binding region includes: a source driver circuit, a flexible printed circuit board, a first selector circuit, a second selector circuit and a plurality of selection connection lines. For at least one selection connection line of the plurality of selection connection lines, one end of the selection connection line is connected to an input port of the first selector circuit, and the other end is connected to an input port of the second selector circuit. The flexible printed circuit board is disposed on one side, away from the display region, of the source driver circuit, and the plurality of selection connection lines are disposed between the source driver circuit and the flexible printed circuit board.

In an exemplary embodiment, the first selector circuit and the second selector circuit are respectively disposed on both sides of the source driver circuit in a direction parallel to an edge of the display region; the edge of the display region is an edge of the display region adjacent to one side of the binding region.

In an exemplary embodiment, a plurality of selector pins are disposed on the flexible printed circuit board, and the selector pins are disposed on both sides of the flexible printed circuit board along the direction parallel to the edge of the display region. For at least one selector pin among the plurality of selector pins, the selector pin is connected with the selection connection line through a selection trace.

FIG. 1 is a schematic structural diagram of a display substrate according to an exemplary embodiment of the present disclosure. As shown in FIG. 1, in an exemplary embodiment, the display substrate includes a display region 100 and a non-display region located at the periphery of the display region 100. The non-display region includes a binding region 200 located on one side of the display region 100 and an edge region located on the other side of the display region 100. The display region 100 at least includes a plurality of display units regularly disposed, and the binding region 200 at least includes a selector circuit, a source driver circuit, and a flexible printed circuit board for connecting signal lines to an external control device. The edge region at least includes a gate driver on array circuit.

Figure 2:
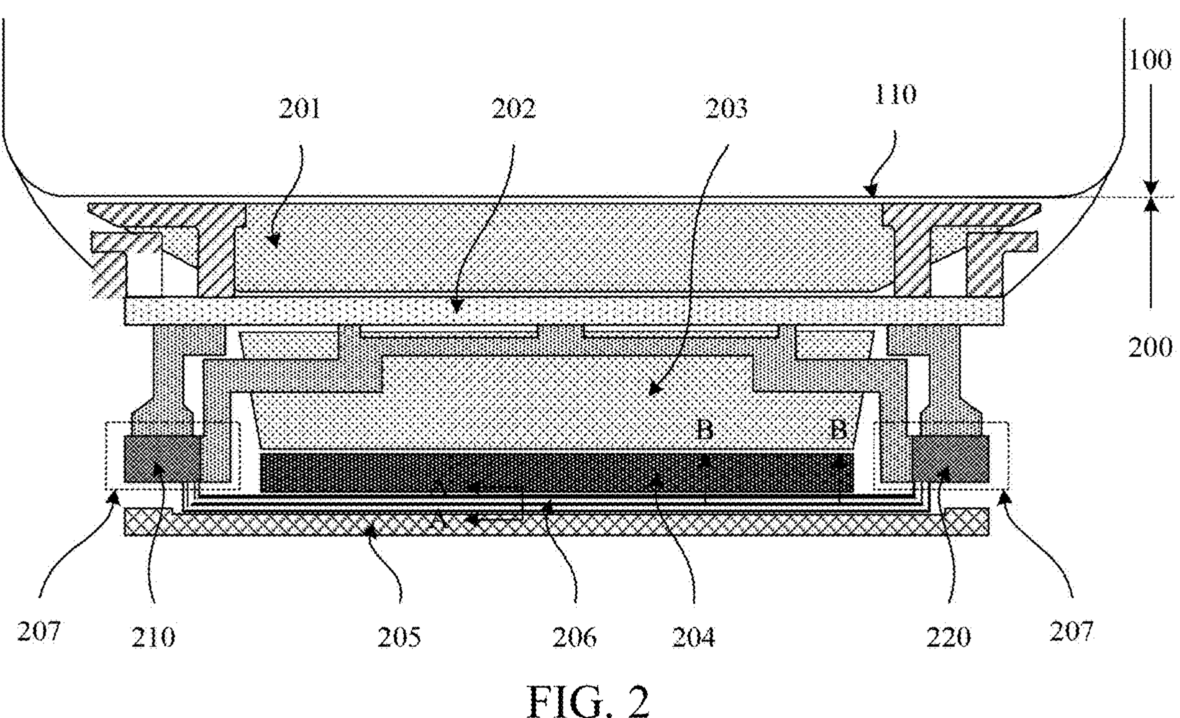
FIG. 2 is a schematic structural diagram of a binding region in a display substrate according to an exemplary embodiment of the present disclosure.

FIG. 2 is a schematic structural diagram of a binding region in a display substrate according to an exemplary embodiment of the present disclosure. As shown in FIG. 2, in an exemplary embodiment, in a plane parallel to the display substrate, the binding region 200 is located on one side of the display region 100, and along the direction away from the display region 100, the binding region 200 may include: a first fanout region 201, a bending region 202, a second fanout region 203, a driver chip region 204, a circuit board region 205, and may also include a selection connection line region 206 and a selector circuit region 207. The first fanout region 201 may be provided with a first power supply line, a second power supply line and a plurality of data transmission lines; wherein a plurality of data transmission lines are configured to connect data line of the display region 100 in a fanout way; the first power supply line (VDD) is configured to connect high-level power supply lines of the display region 100; and the second power supply line (VSS) is configured to connect low-level power supply lines of the edge region. The bending region 202 may be provided with a notch, which is configured to bend the binding region 200 to the back of the display region 100. The second fanout region 203 may be provided with a plurality of data transmission lines led out in a fanout way. The driver chip region 204 may be provided with a Driver IC, which is configured to be connected with a plurality of data transmission lines of the second fanout region 203. The circuit board region 205 may be provided with a flexible printed circuit board (FPC), and the flexible printed circuit board (FPC) includes a plurality of pins connected with a bonding pad of the source driver circuit, and a plurality of pins are configured to be connected with an external control device.

In an exemplary embodiment, along the direction parallel to the edge 110 of the display region, the selector circuit regions 207 may be disposed on both sides of the driver chip region 204; the selector circuit region 207 on one side of the driver chip region 204 may be provided with a first selector circuit 210, and the selector circuit region 207 on the other side of the driver chip region 204 may be provided with a second selector circuit 220. The display region edge 110 is the edge of the display region 100 adjacent to the binding region 200.

In an exemplary embodiment, the selection connection line region 206 may be disposed between the driver chip region 204 and the circuit board region 205, in a direction away from the display region 100. The selection connection line region 206 may be provided with a plurality of selection connection lines, which are configured to achieve connection between the input ports of the first selector circuit 210 and the second selector circuit 220. For at least one of the plurality of selection connection lines, one end of the selection connection line is connected to an input port of the first selector circuit 210, and the other end is connected to an input port of the second selector circuit 220, thus achieving the connection between the input ports with the same input signal in the first selector circuit 210 and the second selector circuit 220.

In an exemplary embodiment, the binding region 200 may include: an antistatic circuit configured to eliminate static electricity, an isolation dam configured to isolate water vapor from entering the display region, and other wiring regions, which is not restricted in the present disclosure.

Figure 3:
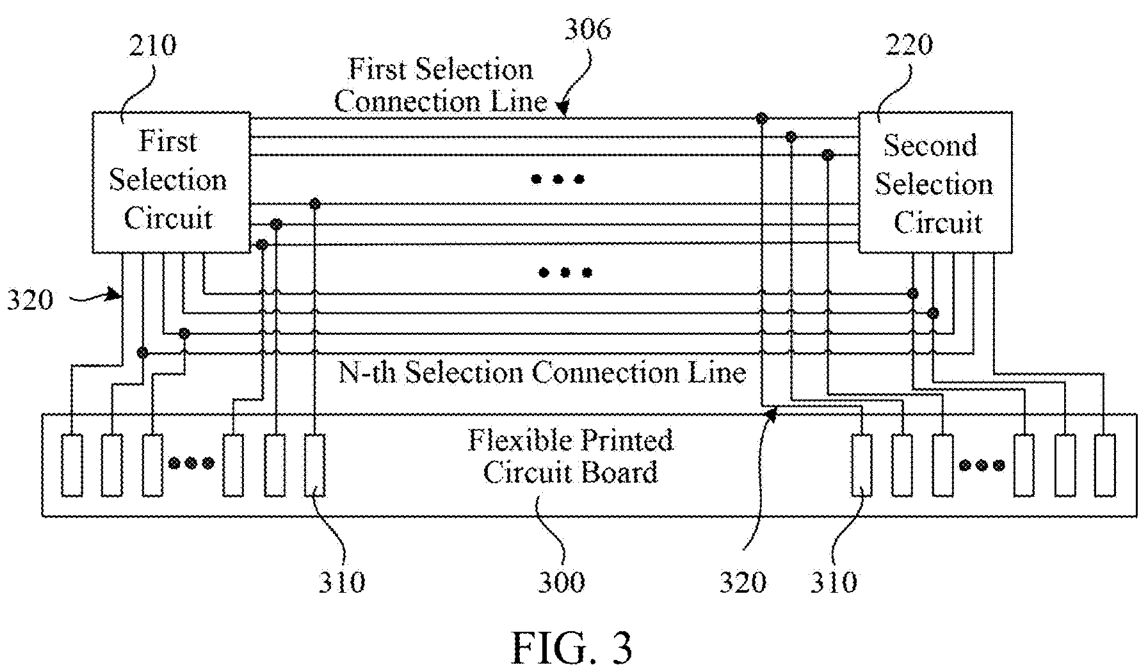
FIG. 3 is a schematic diagram of selection connection lines according to an exemplary embodiment of the present disclosure.

FIG. 3 is a schematic diagram of selection connection lines according to an exemplary embodiment of the present disclosure. As shown in FIG. 3, the first selector circuit 210 and the second selector circuit 220 are respectively disposed on both sides of the driver chip region, each selector circuit includes M input ports; N input ports of the first selector circuit 210 and N input ports of the second selector circuit 220 are correspondingly connected through N selection connection lines 306. That is, the first input port of the first selector circuit 210 and the first input port of the second selector circuit 220 are connected with each other through the first selection connection line 306, . . . , the N-th input port of the first selector circuit 210 and the N-th input port of the second selector circuit 220 are connected with each other through the Nth selection connection line 306. M is a positive integer greater than 2, N is a positive integer greater than or equal to 2, and N is less than or equal to M. In an exemplary embodiment, the i-th input port of the first selector circuit 210 and the i-th input port of the second selector circuit 220 input the same signal, i=1, . . . , N.

The flexible printed circuit board 300 is provided with n selector pins 310, n=2M−N, and the n selector pins 310 can be divided into two sets. In an exemplary embodiment, N may be an even number greater than or equal to 2, and each set includes n/2 selector pins 310. The first set of n/2 selector pins 310 is disposed on the left side, adjacent to the first selector circuit 210, of the flexible printed circuit board 300, and the second set of n/2 selector pins 310 is disposed on the right side, adjacent to the second selector circuit 220, of the flexible printed circuit board 300. In an exemplary embodiment, N may be an odd number greater than or equal to 2, so the first set may include (n−1)/2 selector pins 310 and the second set may include (n+1)/2 selector pins 310. Optionally, the first set may include (n+1)/2 selector pins 310 and the second set may include (n−1)/2 selector pins 310. The first set is disposed on the left side, adjacent to the first selector circuit 210, of the flexible printed circuit board 300, and the second set is disposed on the right side, adjacent to the second selector circuit 220, of the flexible printed circuit board 300. In an exemplary embodiment, other pins may be disposed on the flexible printed circuit board 300, which is not restricted in the present disclosure.

Among the n selector pins 310, N selector pins 310 are connected with N selection connection lines 306 through N selection traces 320, and n−N selector pins 310 are connected with n−N input ports of the first selector circuit 210 and the second selector circuit 220 through n−N selection traces 320. That is, the first selector pin 310 is connected to the first selection connection line 306 through the first selection trace 320, . . . , the N-th selector pin 310 is connected to the N-th selection connection line 306 through the N-th selection trace 320, and the (N+1)-th selector pin 310 is connected to the (N+1)-th input port of the first selector circuit 210 or the (N+1)-th input port of the second selector circuit 220 through the N+1th selection trace 320, . . . , and the n-th selector pin 310 is connected to the M-th input port of the first selector circuit 210 or the M-th input port of the second selector circuit 220 through the nth selection trace 320.

In an exemplary embodiment, among the first set of n/2 selector pins 310, N/2 selector pins 310 are connected with N/2 selection connection lines 306, and (M−N) selector pins 310 are connected with (M−N) input ports of the first selector circuit 210. Among the second set of n/2 selector pins 310, N/2 selector pins 310 are connected with other N/2 selection connection lines 306, and (M−N) selector pins 310 are connected with (M−N) input ports of the second selector circuit 220.

In an exemplary embodiment of the present disclosure, the first selector circuit 210 and the second selector circuit 220 have 2M input ports in total. Since N selection connection lines 306 are provided, N selection connection lines 306 respectively establish connections between the N input ports of the first selector circuit 210 and the N input ports of the second selector circuit 220. Thus only (2M−N) selector pins 310 need to be disposed on the flexible printed circuit board 300 to achieve the signal input of 2M input ports, and 2M selector pins 310 does not need to be disposed on the flexible printed circuit board 300. This effectively reduces the quantity of selector pins, which is beneficial to the pin arrangement of the flexible printed circuit board 300 and improves the reliability of signal input.

In an exemplary embodiment, the quantity of selection connection lines 306 may be determined according to the input signals of the first selector circuit 210 and the second selector circuit 220. In some possible implementations, N may be configured to equal to M, and only M selector pin 310 needs to be disposed on the flexible printed circuit board 300 to achieve the signal input of the first selector circuit 210 and the second selector circuit 220.

In an exemplary embodiment of the present disclosure, the first selector circuit and the second selector circuit are respectively disposed on both sides of the driver chip region; two sets of selector pins are respectively disposed on both sides of the flexible printed circuit board; and a plurality of selection connection lines are configured to establish connections between a plurality of input ports of the first selector circuit and a plurality of input ports of the second selector circuit, which effectively reduces the quantity of selector pins without increase the width of the binding region and thus improves the competitiveness of products.

Figure 4:
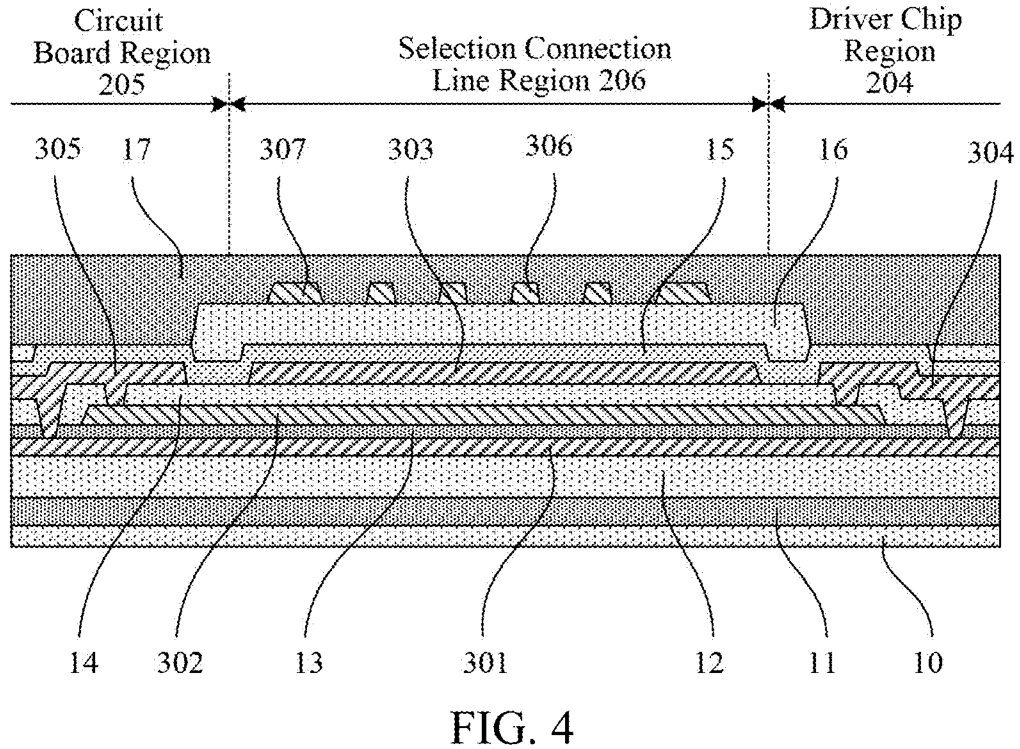
FIG. 4 and FIG. 5 are schematic cross-sectional views of a selection connection line region according to an exemplary embodiment of the present disclosure.
Figure 5:
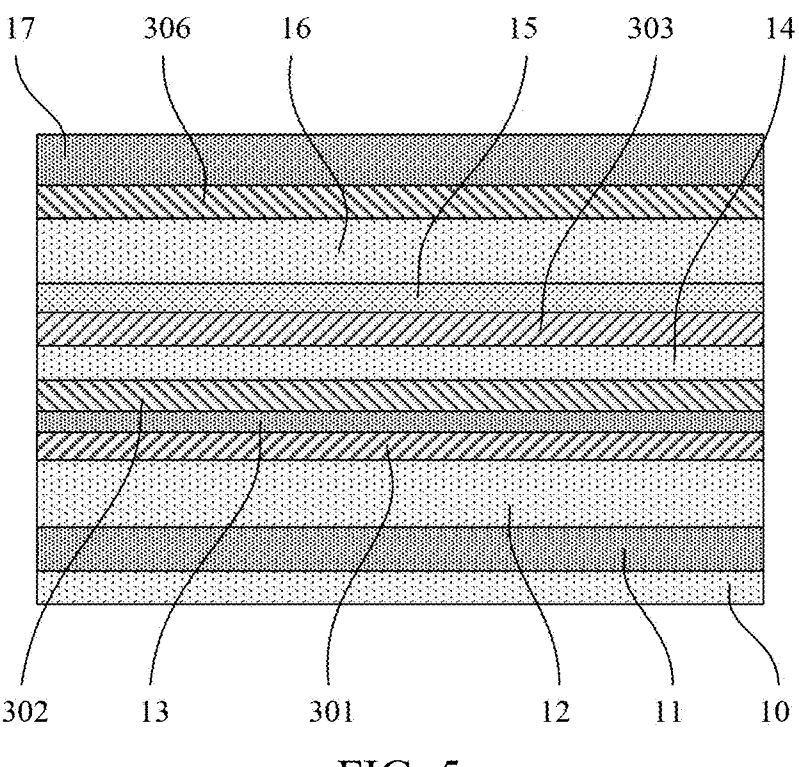

FIG. 4 and FIG. 5 are schematic cross-sectional views of a selection connection line region according to an exemplary embodiment of the present disclosure. FIG. 4 is a cross-sectional view taken along A-A in FIG. 2, and FIG. 5 is a cross-sectional view taken along B-B in FIG. 2. In an exemplary embodiment, N selection connection lines 306 are disposed in a selection connection line region 206, that is, between a driver chip region 204 and a circuit board region 205. As shown in FIG. 4 and FIG. 5, in a plane perpendicular to the display substrate, the selection connection line region 206 includes: a first insulating layer 11 and a second insulating layer 12 stacked on a substrate 10, a first signal connection line 301 disposed on the second insulating layer 12, a third insulating layer 13 disposed on the first signal connection line 301, a second signal connection line 302 disposed on the third insulating layer 13, a fourth insulating layer 14 disposed on the second signal connection line 302, a shielding panel 303 disposed on the fourth insulating layer 14, a fifth insulating layer 15 and a first planarization layer 16 disposed on the shielding panel 303, a plurality of selection connection lines 306 disposed on the first planarization layer 16, and a second planarization layer 17 disposed on the selection connection lines 306. The selection connection line region 206 further includes: a shielding line 307 disposed in the same layer as a selection connection line 306, and the shielding line 307 are disposed on both sides of a plurality of selection connection lines 306.

In an exemplary embodiment, the side of the selection connection line region 206 adjacent to the display region is the driver chip region 204, the driver chip region 204 is provided with driver chip signal lines 304, and the side of the selection connection line region 206 away from the display region is the circuit board region 205, the circuit board region 205 is provided with circuit board signal lines 305. In an exemplary embodiment, the driver chip signal line 304 and the circuit board signal line 305 are disposed in the same layer as the shielding panel 303.

In an exemplary embodiment, the first signal connection line 301 and the second signal connection line 302 are configured to establish a connection between the driver chip signal line 304 and the circuit board signal line 305, allowing the signal of the source driver circuit passes through the selection connection line region 206 to reach the flexible printed circuit board.

In an exemplary embodiment, one end of the driver chip signal line 304 is connected with the source driver circuit in the driver chip region 204, and the other end is respectively connected with the first ends of the first signal connection line 301 and the second signal connection line 302 through the first via and the second via. One end of the circuit board signal line 305 is connected with the flexible printed circuit board in the circuit board region 205, and the other end is respectively connected with the second ends of the first signal connection line 301 and the second signal connection line 302 through the first via and the second via.

In an exemplary embodiment, the structure shown in FIG. 4 and FIG. 5 may only include the first signal connection line 301 or only include the second signal connection line 302, which can still establish connection between the driver chip signal line 304 and the circuit board signal line 305.

In an exemplary embodiment, in a plane perpendicular to the display substrate, the display region 100 includes: a first insulating layer disposed on a substrate, an active layer disposed on the first insulating layer, a second insulating layer disposed on the active layer, a first gate metal layer disposed on the second insulating layer, a third insulating layer disposed on the first gate metal layer, a second gate metal layer disposed on the third insulating layer, a fourth insulating layer disposed on the second gate metal layer, a first source-drain metal layer disposed on the fourth insulating layer, a fifth insulating layer and a first planarization layer disposed on the first planarization layer, and a second source-drain metal layer disposed on the first planarization layer.

In an exemplary embodiment, the first signal connection lines 301 of the selection connection line region 206 is disposed on the same layer as the first gate metal layer of the display region 100, and are simultaneously formed by the same patterning process.

In an exemplary embodiment, the second signal connection lines 302 of the selection connection line region 206 is disposed on the same layer as the second gate metal layer of the display region 100, and are simultaneously formed by the same patterning process.

In an exemplary embodiment, the shielding panels 303 of the selection connection line region 206 is disposed on the same layer as the first source-drain metal layer of the display region 100, and are simultaneously formed by the same patterning process.

In an exemplary embodiment, the selection connection lines 306 of the selection connection line region 206 is disposed on the same layer as the second source-drain metal layer of the display region 100, and are simultaneously formed by the same patterning process.

The following is an exemplary explanation through a preparation process of the display substrate. The "patterning process" mentioned in the present disclosure includes processes, such as photoresist coating, mask exposure, development, etching and photoresist stripping is for metal materials, inorganic materials or transparent conductive materials, and coating, mask exposure and development for organic materials. Deposition may be implemented by any one or more of sputtering, evaporation and chemical vapor deposition, coating may be implemented by any one or more of spraying coating, spin coating and ink-jet printing, and etching may be implemented by any one or more of dry etching and wet etching, and these are not restricted in the present disclosure. "Thin film" refers to a layer of thin film fabricated by a certain material on a base substrate by using deposition, coating or another process. If the "film" does not need a patterning process during the whole preparing process, the "film" can also be called a "layer". If the "thin film" needs a patterning process throughout the whole manufacturing process, it is referred to as a "thin film" before the patterning process and as a "layer" after the patterning process. The "layer" after the patterning process contains at least one "pattern". In the present disclosure, "A and B are disposed on the same layer" indicates that A and B are simultaneously formed by the same patterning process, and the "thickness" of the film layer is the dimension of the film layer in the direction perpendicular to the display substrate. In an exemplary embodiment of the present disclosure, "an orthographic projection of A includes an orthographic projection of B" means that a boundary of the orthographic projection of B falls within a boundary range of the orthographic projection of A, or a boundary of the orthographic projection of A overlaps with a boundary of the orthographic projection of B.

(1) A substrate 10 is prepared on a glass carrier plate 1. In an exemplary embodiment of the present disclosure, the substrate 10 may include a first flexible material layer, a first inorganic material layer, a semiconductor layer, a second flexible material layer and a second inorganic material layer which are stacked on the glass carrier plate 1. The materials of the first and second flexible material layers may be polyimide (PI), polyethylene terephthalate (PET) or polymer soft film after surface treatment, and the materials of the first and second inorganic material layers can be silicon nitride (SiNx) or silicon oxide (SiOx) to improve the water and oxygen resistance of the substrate. The first and second inorganic material layers are also called barrier layers, and the material of the semiconductor layer can be amorphous silicon (a-si). In an exemplary embodiment, taking the laminated structure PI1/Barrier1/a-si/PI2/Barrier2 as an example, the preparation process may include: coating a layer of polyimide on the glass carrier plate 1, and forming a first flexible (PI1) layer after cured to film; subsequently, depositing a layer of barrier film on the first flexible layer to form a first barrier (Barrier 1) layer covering the first flexible layer; then depositing a layer of amorphous silicon film on the first barrier layer to form an amorphous silicon (a-si) layer covering the first barrier layer; then coating a layer of polyimide on the amorphous silicon layer, and forming a second flexible (PI2) layer after cured to film; then depositing a layer of barrier film on the second flexible layer to form a second barrier (Barrier 2) layer covering the second flexible layer, to complete the preparation of the substrate 10.

In an exemplary embodiment, the substrate 10 may be a hard substrate.

Figure 6:
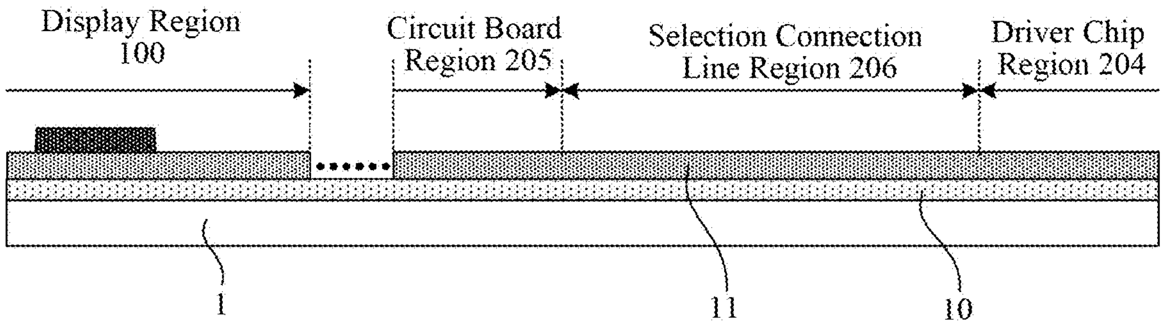
FIG. 6 is a schematic diagram of a display substrate after a pattern of an active layer is formed according to an exemplary embodiment of the present disclosure.

(2) A first insulating film and an active layer film are sequentially deposited on the substrate 10, and the active layer film is patterned through a patterning process to form a first insulating layer 11 covering the whole substrate 10 and a pattern of an active layer disposed on the first insulating layer 11. The pattern of the active layer at least includes the first active layer formed in the display region 100. The above content is shown in FIG. 6. After this patterning process, the first insulating layer 11 disposed on the substrate 10 is included in the driver chip region 204, the circuit board region 205 and the selection connection line region 206 in the binding region.

Figure 7:
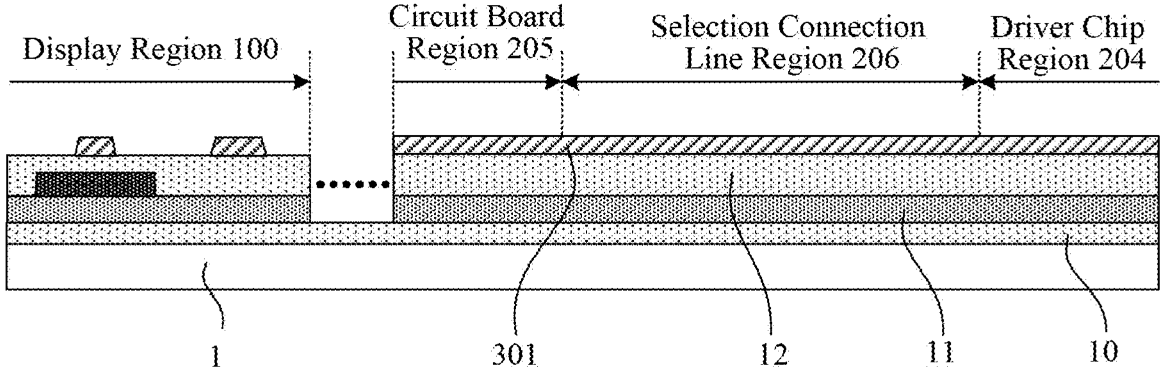
FIG. 7 is a schematic diagram of a display substrate after a pattern of a first gate metal layer is formed according to an exemplary embodiment of the present disclosure.

(3) A second insulating film and a first metal film are sequentially deposited, the first metal film is patterned through a patterning process to form a second insulating layer 12 covering the pattern of the active layer and the pattern of the first gate metal layer disposed on the second insulating layer 12. The pattern of the first gate metal layer at least includes: a first gate electrode, a first capacitor electrode and a first signal connection line 301. The first gate electrode and the first capacitor electrode are formed in the display region 100. The first signal connection line 301 is formed in the selection connection line region 206 in the binding region. The driver chip region 204 is adjacent to the selection connection line region 206 and the circuit board region 205 is adjacent to the selection connection line region 206. The above content is shown in FIG. 7. After this patterning process, the selection connection line region 206 in the binding region includes the first insulating layer 11, the second insulating layer 12 and the first signal connection line 301 stacked on the substrate 10. In an exemplary embodiment, since the selection connection line region 206 is provided with a plurality of selection connection lines extending in a direction parallel to the edge of the display region, the signal lines driver the source driver circuit in the chip region 204 and the signal lines of the flexible printed circuit board in the circuit board region 205 need to cross the selection connection line region 206. In an exemplary embodiment of the present disclosure, the first signal connection line 301 is configured to connect the signal line of the subsequently formed source driver circuit and the signal line of the flexible printed circuit board, so that the signal lines of the source driver circuit and the flexible printed circuit board are connected through the first signal connection line 301 to ensure signal transmission.

Figure 8:
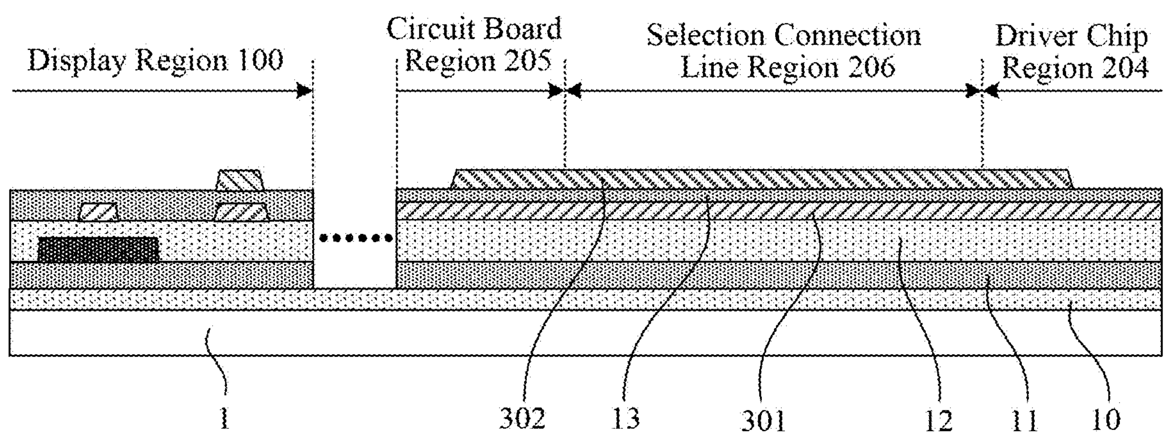
FIG. 8 is a schematic diagram of a display substrate after a pattern of a second gate metal layer is formed according to an exemplary embodiment of the present disclosure.

(4) A third insulating film and a second metal film are sequentially deposited, the second metal film is patterned through a patterning process to form a third insulating layer 13 covering the first gate metal layer and the pattern of the second gate metal layer disposed on the third insulating layer 13. The pattern of the second gate metal layer at least includes a second capacitor electrode and a second signal connection line 302. The second capacitor electrode is formed in the display region 100, and the position of the second capacitor electrode corresponds to the position of the first capacitor electrode. The second signal connection line 302 is formed in the selection connection line region 206 in the binding region, a region of the driver chip region 204 adjacent to the selection connection line region 206, and a region of the circuit board region 205 adjacent to the selection connection line region 206. The above content is shown in FIG. 8. After this patterning process, the selection connection line region 206 in the binding region includes: the first insulating layer 11, the second insulating layer 12, the first signal connection line 301, the third insulating layer 13 and the second signal connection line 302 stacked on the substrate 10. In an exemplary embodiment, the second signal connection line 302 is configured to connect signal line of the subsequently formed source driver circuit and the signal line of the flexible printed circuit board.

Figure 9:
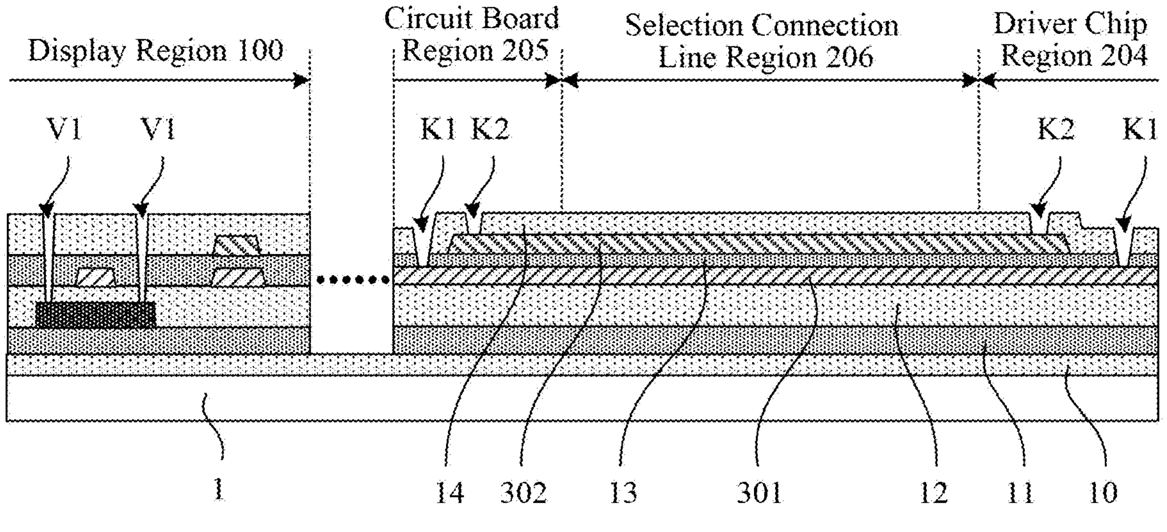
FIG. 9 is a schematic diagram of a display substrate after a pattern of a fourth insulating layer is formed according to an exemplary embodiment of the present disclosure.

(5) A fourth insulating film is deposited, and the fourth insulating film is patterned through a patterning process to form a fourth insulating layer 14 covering the second gate metal layer. The fourth insulating layer 14 is provided with a plurality of vias, and the plurality of vias at least include two active vias V1, two first vias K1 and two second vias K2. The above content is shown in FIG. 9.

In an exemplary embodiment, two active vias V1 are formed in the display region 100. The fourth insulating layer 14, the third insulating layer 13 and the second insulating layer 12 in the two active vias V1 are etched away to expose the surface of the first active layer.

In an exemplary embodiment, a second via K2 and a first via K1 are formed in the driver chip region 204 of the binding region. The distance between the second via K2 and the selection connection line region 206 is smaller than the distance between the first via K1 and the selection connection line region 206. The fourth insulating layer 14 and the third insulating layer 13 in the first via K1 are etched away to expose the surface of a first end of the first signal connection line 301. The fourth insulating layer 14 in the second via K2 are etched away to expose the surface of a first end of the second signal connection line 302. The first ends are ends, adjacent to the driver chip region 204, of the first signal connection line 301 and the second signal connection line 302.

In an exemplary embodiment, another second via K2 and another first via K1 are formed in the circuit board region 205 in the binding region, and the distance between the second via K2 and the selection connection line region 206 is smaller than that between the first via K1 and the selection connection line region 206. The fourth insulating layer 14 and the third insulating layer 13 in the first via K1 are etched away to expose the surface of a second end of the first signal connection line 301. The fourth insulating layer 14 in the second via K2 is etched away to expose the surface of a second end of the second signal connection line 302. The second ends are ends, adjacent to the circuit board region 205, of the first signal connection line 301 and the second signal connection line 302.

After this patterning process, the selection connection line region 206 in the binding region includes the first insulating layer 11, the second insulating layer 12, the first signal connection line 301, the third insulating layer 13, the second signal connection line 302 and the fourth insulating layer 14 stacked on the substrate 10.

In an exemplary embodiment, the two active vias V1 are configured to respectively connect the subsequently formed first source electrode and the second drain electrode with the first active layer. The two second vias K2 are configured to connect the subsequently formed driver chip signal lines and circuit board signal lines with the second signal connection lines 302, and the two first vias K1 are configured to connect the subsequently formed driver chip signal lines and circuit board signal lines with the first signal connection lines 301, thus achieving the connection between the signal lines of the source driver circuit and the signal lines of the flexible printed circuit board.

Figure 10:
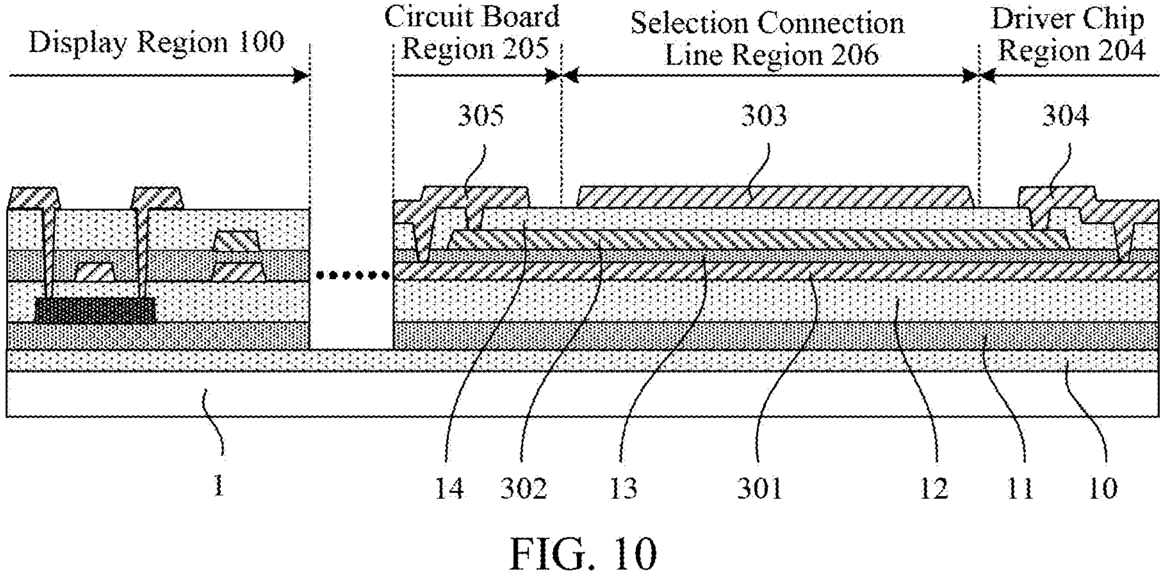
FIG. 10 is a schematic diagram of a display substrate after a pattern of a first source-drain metal layer is formed according to an exemplary embodiment of the present disclosure.

(6) A third metal film is deposited, the third metal film is patterned through a patterning process, and a pattern of a first source-drain metal layer is formed on the fourth insulating layer 14. The first source-drain metal layer at least includes: a first source electrode, a first drain electrode, a shielding panel 303, a driver chip signal line 304 and a circuit board signal line 305. The above content is shown in FIG. 10.

In an exemplary embodiment, a first source electrode and a first drain electrode are formed in the display region 100, and are respectively connected with the first active layer through first vias.

In an exemplary embodiment, the shielding panel 303 is formed in the selection connection line region 206 in the binding region, and is configured to provide a shielding function for the subsequently formed selection connection line. In an exemplary embodiment, the shielding panel 303 may be connected to the first power supply line VDD or the second power supply line VSS of the pixel driver circuit, or to the high voltage power supply line VGH or the low voltage power supply line VGL of the gate driver on array circuit.

In an exemplary embodiment, the driver chip signal line 304 is formed in the driver chip region 204 in the binding region, with its one end, away from the selection connection line region 206, connected to the source driver circuit, and the end, adjacent to the selection connection line region 206, connected to the first end of the first signal connection line 301 through a first via and connected to the first end of the second signal connection line 302 through a second via.

In an exemplary embodiment, the circuit board signal line 305 is formed is formed in the circuit board region 205 of the binding region, with its one end, away from the selection connection line region 206, connected to the flexible printed circuit, and the end, adjacent to the selection connection line region 206, connected to the second end of the first signal connection line 301 through a first via and connected to the first end of the second signal connection line 302 through a second via.

In this way, a dual-signal connection line structure connecting the driver chip signal line 304 and the circuit board signal line 305 is formed in the selection connection line region 206. In the driver chip region 204 and the circuit board region 205, the driver chip signal line 304 and the circuit board signal line 305 are disposed on the first source-drain metal layer (SD1), and in the selection connection line region 206, the signal lines are respectively disposed on the first gate metal layer (Gate1) and the second gate metal layer (Gate2). That is to say, in the selection connection line region 206, the signal lines are in the Gate1 and Gate2 layers, and in the region outside the selection connection line region 206, the signal lines are in the SD1 layer. The dual-signal connection line structure of the exemplary embodiment of the present disclosure not only reduces the connection resistance, but also ensures the reliability of signal transmission.

In an exemplary embodiment, the first signal connection line 301 may be disposed only on the first gate metal layer, and only two first via holes K1 are disposed on the fourth insulating layer 14 to form a single signal connection line structure. Optionally, the second signal connection line 302 may be disposed only on the second gate metal layer, and only two second via holes K2 are disposed on the fourth insulating layer 14 to form a single signal connection line structure.

Figure 11:
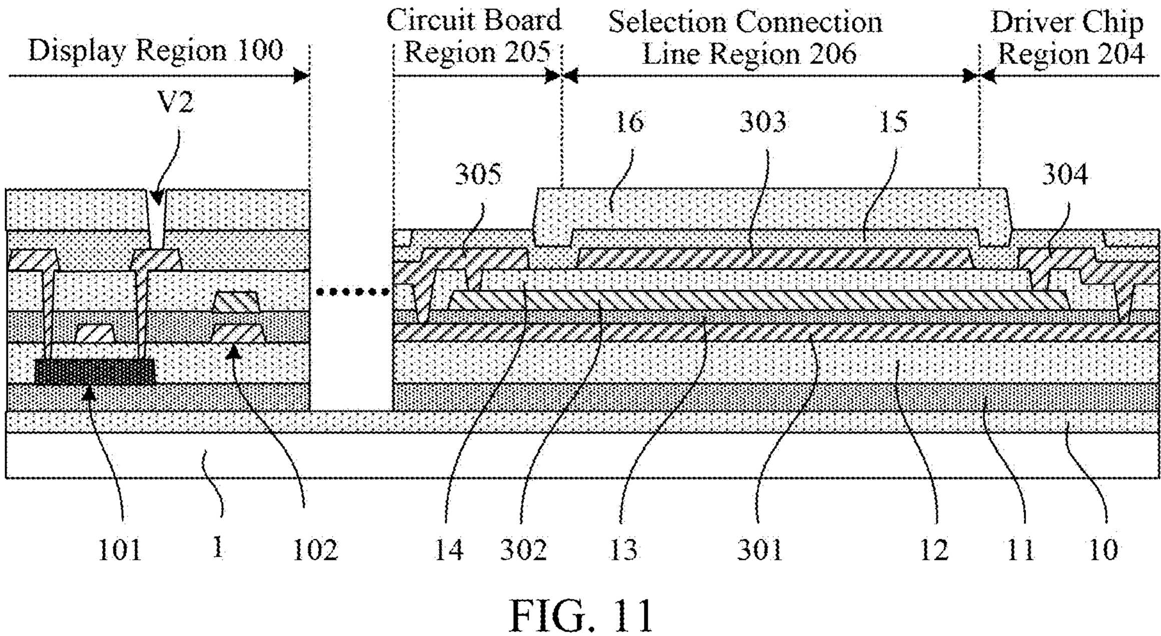
FIG. 11 is a schematic diagram of a display substrate after a pattern of a composite insulating layer is formed according to an exemplary embodiment of the present disclosure.

(7) On the substrate 10 with the above pattern, a fifth insulating film is firstly deposited, and a first planarization film of organic material is then coated to form a fifth insulating layer 15 covering the whole substrate 10 and a first planarization (PLN) layer 16 disposed on the fifth insulating layer 15. Through a patterning process of masking, exposure, and development, a connecting via V2 is formed on the first planarization layer 16, and the connecting via V2 is formed in the display region 100. The first planarization layer 16 and the fifth insulating layer 15 in the connecting via V2 are removed to expose the surface of the first drain electrode of the first transistor 101. The above content is shown in FIG. 11. In an exemplary embodiment, the first planarization layer 16 may be formed only in the selection connection line region 206 in the binding region; the fifth insulating layer 15 and the first planarization layer 16 are called composite insulating layers.

In an exemplary embodiment, the composite insulating layer may include only the fifth insulating layer 15 or only the first planarization layer 16. Regarding situations where the composite insulating layer only includes the first planarization layer 16, the first planarization layer 16 can be directly formed on the substrate with the aforementioned pattern, and the first planarization layer 16 can be formed in the driver chip region 204, the circuit board region 205 and the selection connection line region 206 in the binding region.

Figure 12:
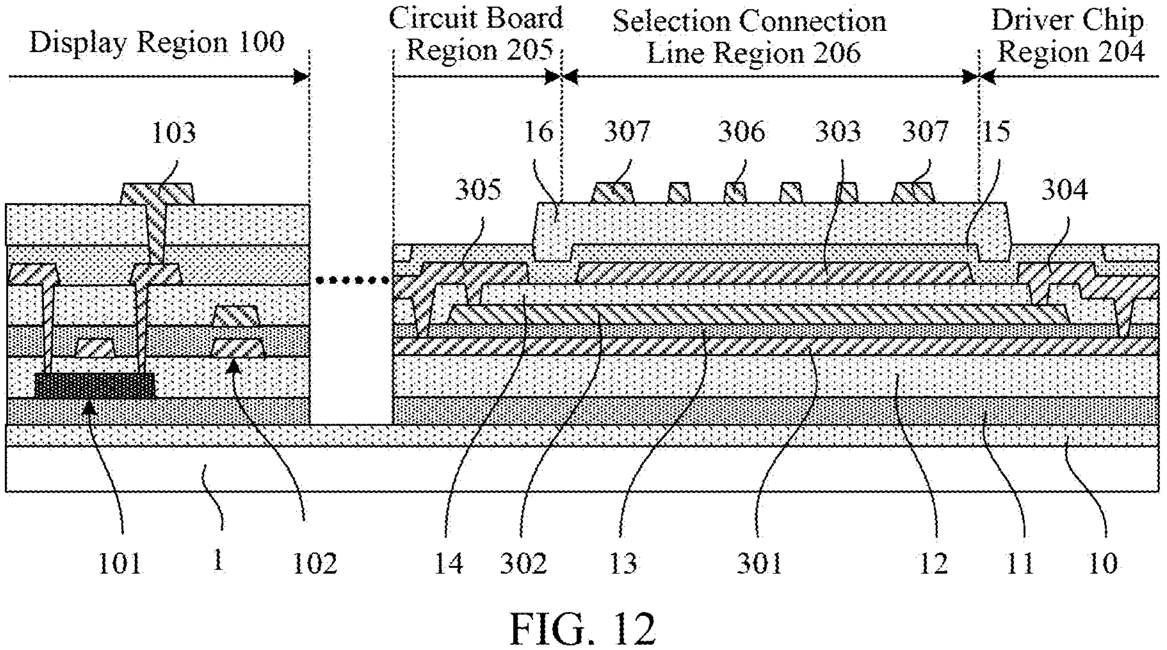
FIG. 12 is a schematic diagram of a display substrate after a pattern of a second source-drain metal layer is formed according to an exemplary embodiment of the present disclosure.

(8) A fourth metal thin film is deposited on the substrate with the aforementioned pattern, the fourth metal thin film is patterned through a patterning process, and a pattern of a second source-drain metal layer is formed on the first planarization layer 16. The second source-drain metal layer at least includes: a connection electrode 103, a plurality of selection connection lines 306 and at least two shielding lines 307. The connection electrode 103 is formed in the display region 100 and is connected to the first drain electrode of the first transistor 101 through a connection via. A plurality of selection connection lines 306 and at least two shielding lines 307 are formed in the selection connection line region 206 in the binding region. The above content is shown in FIG. 12.

In an exemplary embodiment, a plurality of selection connection lines 306 are disposed at intervals and are configured to establish connections between a plurality of input ports of the first selector circuit 210 and that of the second selector circuit 220. For at least one selection connection line 306 among a plurality of selection connection lines 306, one end of the selection connection line 306 is connected to the input port of the first selector circuit, and the other end is connected to the input port of the second selector circuit.

In an exemplary embodiment, two shielding lines 307 are respectively disposed on both sides of a plurality of selection connection lines 306. That is, at least one shielding line 307 is disposed on one side, adjacent to the driver chip region 204, of the selection connection line region 206 (i.e. The side where a plurality of selection connecting lines are adjacent to the display region); at least one shielding line 307 is disposed on one side, adjacent to the circuit board region 205, of the selection connection line region 206 (i.e. The side where a plurality of selection connecting lines are away from the display region). At least two shielding lines 307 are configured to provide a lateral shielding function for the plurality of selection connection lines 306.

In an exemplary embodiment, along the direction away from the display region, the width of the orthographic projection of the shielding line 307 on the substrate is larger than that of the selection connection line 306 on the substrate. In an exemplary embodiment of the present disclosure, "width" refers to the feature dimension along the direction away from the display region.

In an exemplary embodiment, the boundaries of the orthogonal projection of a plurality of selection connection lines 306 on the substrate are located within the boundary range of the orthogonal projection of the shielding panel 303 on the substrate.

In an exemplary embodiment, the boundary of the orthogonal projection of the at least two shielding lines 307 on the substrate is located within the boundary range of the orthogonal projection of the shielding panel 303 on the substrate.

In an exemplary embodiment, at least two shielding lines 307 may be connected to the first power supply line VDD or the second power supply line VSS of the pixel driver circuit, or to the high voltage power supply line VGH or the low voltage power supply line VGL of the gate driver on array circuit.

In an exemplary embodiment, the width of each selection connection line 306 is about 1.5 μm to 6.0 μm, and the width of the spacing between adjacent selection connection lines 306 is about 2.0 μm to 6.0 μm. The width of each shielding line 307 is about 10 μm to 20 μm, and the width of the shielding panel 303 is about 500 μm to 700 μm.

In an exemplary embodiment, the driver chip region 204 and the circuit board region 205 may form corresponding signal lines and pins, which is not restricted in the present disclosure.

Figure 13:
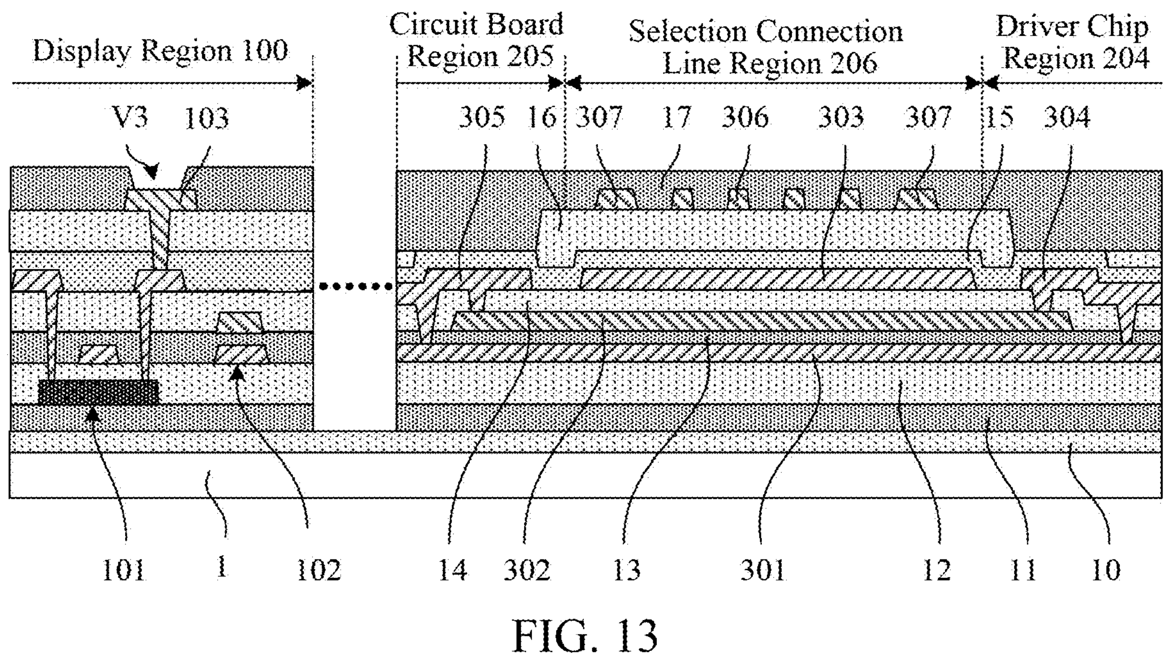
FIG. 13 is a schematic diagram of a display substrate after a pattern of a second planarization layer is formed according to an exemplary embodiment of the present disclosure.

(9) On the substrate 10 with the aforementioned pattern, a second planarization film of organic material is coated, a second planarization layer 17 covering the entire substrate 10 is formed through the patterning process of masking, exposure, and development. An anode via V3 is formed on the second planarization layer 17 and is formed in the display region 100. The second planarization layer 17 in the anode via V3 is removed to expose the surface of the connection electrode 103. The above content is shown in FIG. 13.

To this point, the patterns of a driver structure layer of the display region 100 and a binding structure layer of the binding region 200 are prepared and completed on the substrate 10. As shown in FIG. 13, in the driver structure layer of the display region 100, the first active layer, the first gate electrode, the first source electrode and the first drain electrode constitute a first transistor 101, and the first capacitor electrode and the second capacitor electrode constitute a first storage capacitor 102.

The binding structure layer of the binding region 200 includes: a first insulating layer 11, a second insulating layer 12, a third insulating layer 13, a fourth insulating layer 14, a shielding panel 303, a driver chip signal line 304, a circuit board signal line 305, a fifth insulating layer 15, a first planarization layer 16, a plurality of selection connection lines 306, at least two shielding lines 307, and a second planarization layer 17.

The first insulating layer 11 and the second insulating layer 12 are disposed on the substrate 10.

The first signal connection line 301 is disposed on the second insulating layer 12.

The third insulating layer 13 covers the first signal connection line 301.

The second signal connection line 302 is disposed on the third insulating layer 13.

The fourth insulating layer 14 covers the second signal connection line 302, and is provided with a plurality of vias including two first vias K1 exposing first and second ends of the first signal connection line 301 and two second vias K2 exposing first and second ends of the second signal connection line 302.

The shielding panel 303, the driver chip signal line 304 and the circuit board signal line 305 are disposed on the fourth insulating layer 14; the shielding panel 303 is formed in the selection connection line region 206 in the binding region; the driver chip signal line 304 is formed in the driver chip region 204 of the binding region, and is respectively connected to the first ends of the first signal connection line 301 and the second signal connection line 302 through a first via K1 and a second via K2 at the first end; the circuit board signal line 305 is formed in the circuit board region 205 in the binding region, and is respectively connected to the second ends of the first signal connection line 301 and the second signal connection line 302 through a first via K1 and a second via K2 at the second end.

The fifth insulating layer 15 covers the shielding panel 303, the driver chip signal line 304 and the circuit board signal line 305. The first planarization layer 16 is disposed on the fifth insulating layer 15.

The plurality of selection connection lines 306 and at least two shielding lines 307 are disposed on the first planarization layer 16, the at least two shielding lines 307 are respectively disposed on both sides of the plurality of selection connection lines 306.

The second planarization layer 17 covers the plurality of selection connection lines 306 and at least two shielding lines 307.

In an exemplary embodiment, the display substrate further includes: an anode, a pixel definition (PDL) layer, a spacer post (PS), an organic light-emitting layer, a cathode and an encapsulation layer formed in the display region 100. The encapsulation layer may include: a first encapsulation layer, a second encapsulation layer and a third encapsulation layer which are stacked; the first encapsulation layer and the third encapsulation layer are made of inorganic materials, and the second encapsulation layer is made of organic materials.

In an exemplary embodiment, the first insulating layer, the second insulating layer, the third insulating layer, the fourth insulating layer and the fourth insulating layer may adopt any one or more of silicon oxide (SiOx), silicon nitride (SiNx) and silicon oxynitride (SiON), and can be a single layer, a plurality of layers or a composite layer. The first insulating layer is called buffer layer to improve the moisture and oxygen resistance of the substrate, the second and third insulating layers are called gate insulating (GI) layer, the fourth insulating layer is called interlayer insulating (ILD) layer, and the fifth insulating layer is called passivation (PVX) layer. The first metal film, the second metal film, the third metal film, and the fourth metal film may adopt metal materials, such as any one or more of silver (Ag), copper (Cu), aluminum (Al), titanium (Ti) and molybdenum (Mo), or alloy materials of the above metals, such as AlNd alloy or MoNb alloy, which may be a single-layer structure or a multilayer composite structure, such as Ti/Al/Ti, etc. The active layer film may adopt various materials such as amorphous indium gallium zinc oxide material (a-IGZO), zinc oxynitride (ZnON), indium zinc tin oxide (IZTO), amorphous silicon (a-Si), polysilicon (p-Si), hexathiophene, polythiophene, or the like, that is, the present disclosure is applicable to transistors prepared based on oxide technology, silicon technology and organic technology.

It can be seen from the structure of the display substrate and its preparation process of the exemplary embodiment of the present disclosure that, according to the exemplary embodiment of the present disclosure, a plurality of selection connection lines are disposed in the selection connection line region, the plurality of selection connection lines establish a connection between the plurality of input ports of the first selector circuit 210 and the plurality of input ports of the second selector circuit 220. The input ports of the first selector circuit 210 and the second selector circuit 220 with the same input signal are connected together. Only one selector pin is needed to achieve the signal input of the two input ports. This effectively reduces the quantity of selector pins, which is beneficial to the pin arrangement of the flexible printed circuit board and improves the reliability of signal input. According to an exemplary embodiment of the present disclosure, the first selector circuit and the second selector circuit are respectively disposed on both sides of the driver chip region, the pins of the selector circuit are respectively disposed on both sides of the flexible printed circuit board without increase the width of the binding region, thus improving the competitiveness of products.

According to the exemplary embodiment of the present disclosure, the first signal connection line and the second signal connection line are respectively formed by the first gate metal layer and the second gate metal layer, which achieves the connection between the driver chip signal line and the circuit board signal line and ensures the signal transmission. The dual-signal connection line structure not only reduces the connection resistance, but also ensures the reliability of signal transmission.

According to the exemplary embodiment of the present disclosure, the first source-drain metal layer is used to form a shielding panel that provides a shielding function for the selection connection line, avoiding the interference to the plurality of selection connection lines from the first signal connection line and the second signal connection line, and avoiding the interference to the first signal connection line and the second signal connection line from the plurality of selection connection lines, thus improving the reliability of signal transmission.

According to the exemplary embodiment of the present disclosure, shielding lines are formed on both sides of the plurality of selection connection lines. The shielding line provides lateral shielding function for the plurality of selection connection lines, avoiding the interference of the signal lines in the driver chip region and the circuit board region to the plurality of selection connection lines, and avoiding the interference of the plurality of selection connection lines to the signal lines in the driver chip region and the circuit board region, thus improving the reliability of signal transmission.

The structure and preparation process of the display substrate shown in an exemplary embodiment of the present disclosure are merely illustrative. In an exemplary embodiment, corresponding structures can be changed and patterning processes can be added or reduced according to actual needs, which is not restricted in the present disclosure.

Figure 14:
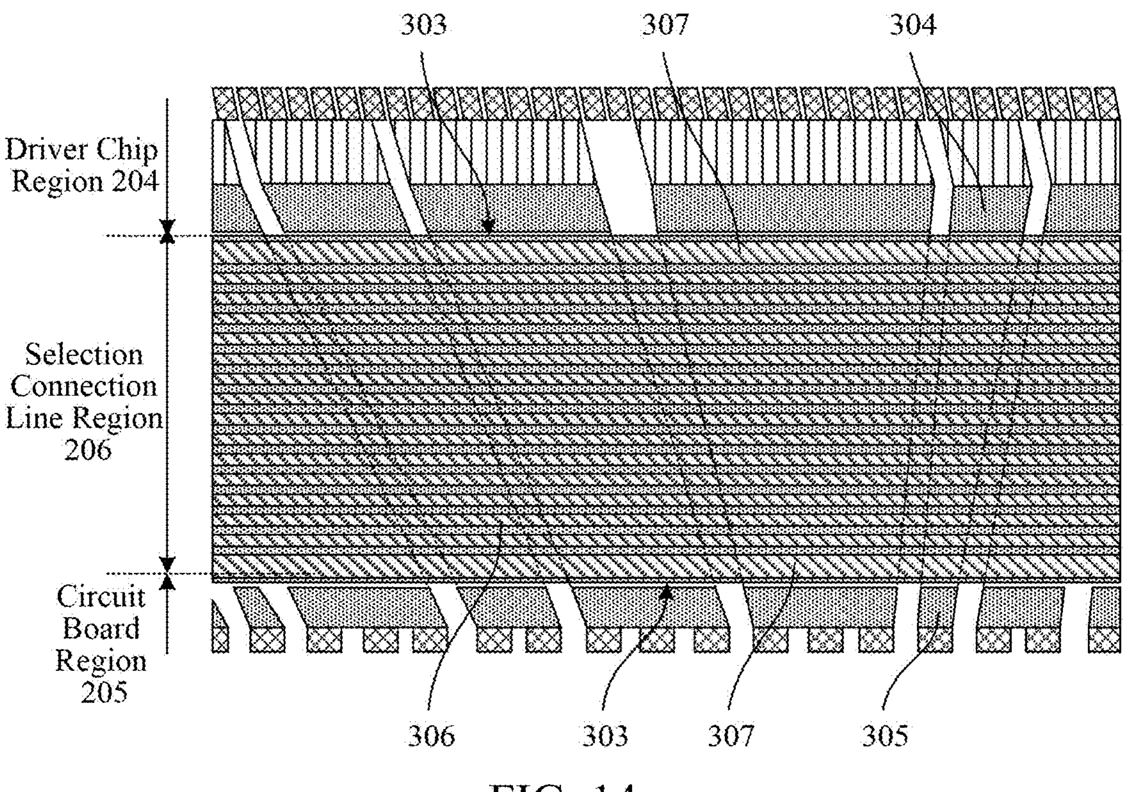
FIG. 14 is s schematic plan view of a selection connection line region according to an exemplary embodiment of the present disclosure.

FIG. 14 is s schematic plan view of a selection connection line region according to an exemplary embodiment of the present disclosure. As shown in FIG. 14, the shielding panel 303 is disposed on the first source-drain metal layer, providing shielding function for the first and second signal connection lines underneath it and the selection connection lines 306 above it, and two shielding lines 307 are disposed on both sides of the selection connection lines 306, providing lateral shielding function for the selection connection lines 306. An end, adjacent to selection connection line region 206, of driver chip signal line 304 is connected to an end, adjacent to selection connection line region 206, of circuit board signal line 305, through first signal connection lines disposed in the first gate metal layer and second signal connection lines disposed in the second gate metal layer. An end, away from selection connection line region 206, of the driver chip signal line 304 is connected to the source driver circuit of the driver chip region 204, and an end, away from the selection connection line region 206, of the circuit board signal line 305 is connected to the flexible printed circuit board of the circuit board region 205.

Figure 15:
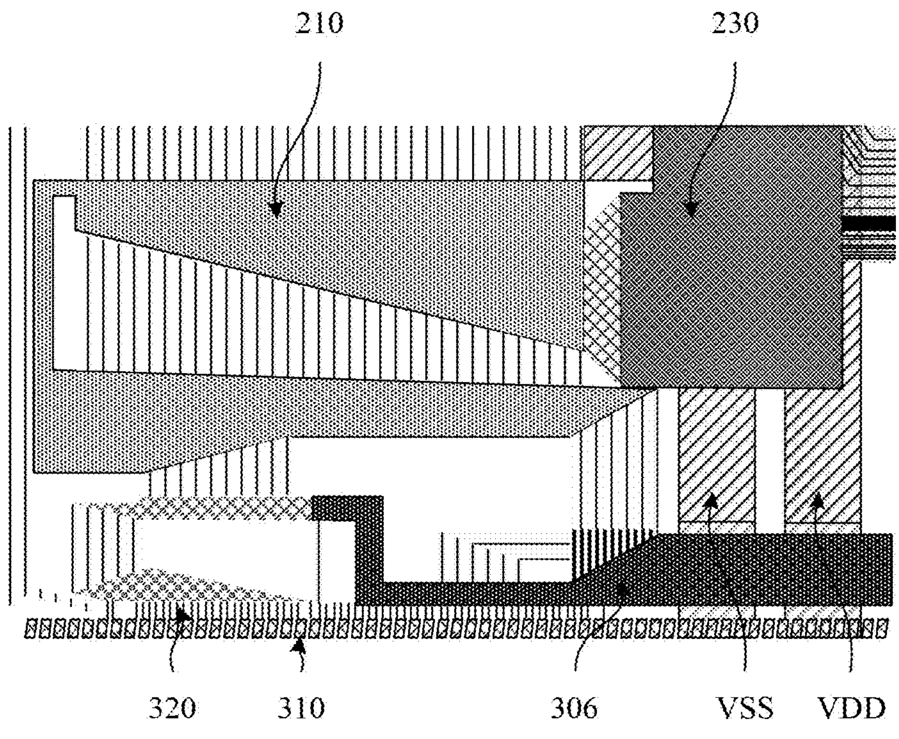
FIG. 15 and FIG. 16 are schematic diagrams of a selector circuit according to an exemplary embodiment of the present disclosure.
Figure 16:
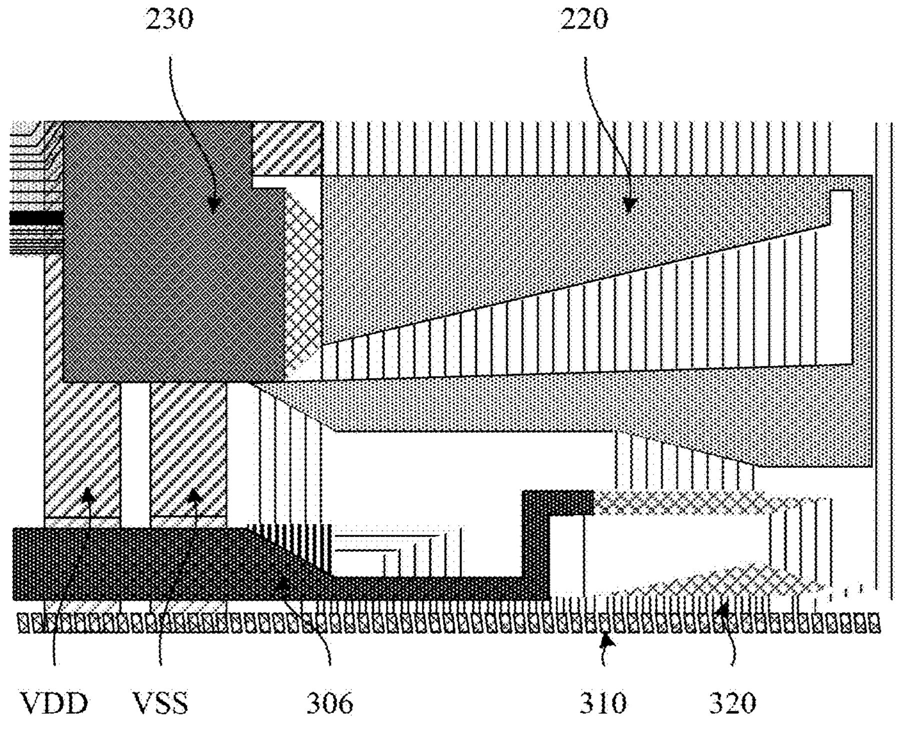

FIG. 15 and FIG. 16 are schematic plan views of selector circuit according to an exemplary embodiment of the present disclosure. As shown in FIG. 15, the output port of the first selector circuit 210 is connected with the touch electrodes of the display region through a plurality of TSP Trace 230, a part of the input port of the first selector circuit 210 is connected with some selector pins 310 on the left side of flexible printed circuit board through selection traces 320, and another part of the input port of the first selector circuit 210 is connected with the input port of the second selector circuit through the plurality of selection connection lines 306, and the selection connection lines 306 are connected with another part of the selector pins 310 on the left side of flexible printed circuit board through selection traces 320. The first power supply line VDD and the second power supply line VSS are disposed on the first gate metal layer and the second gate metal layer in the region where the plurality of selection connection lines 306 are located, and the first power supply line VDD and the second power supply line VSS are disposed on the first source-drain metal layer in the region outside the plurality of selection connection lines 306. As shown in FIG. 16, the output port of the second selector circuit 220 is connected with the touch electrodes in the display region through a plurality of TSP Traces 230; a part of the input port of the second selector circuit 220 is connected with a part of the selector pins 310 on the right side of flexible printed circuit board through selection traces 320, and another part of the input port of the first selector circuit 210 is connected with the input port of the first selector circuit through the plurality of selection connection lines 306, and the plurality of selection connection lines 306 are connected with another part of the selector pins 310 on the right side of the flexible printed circuit board through selection trace 320. The first power supply line VDD and the second power supply line VSS are disposed on the first gate metal layer and the second gate metal layer in the region where the plurality of selection connection lines 306 are located, and the first power supply line VDD and the second power supply line VSS are disposed on the first source-drain metal layer in the region outside the plurality of selection connection lines 306.

Figure 17:
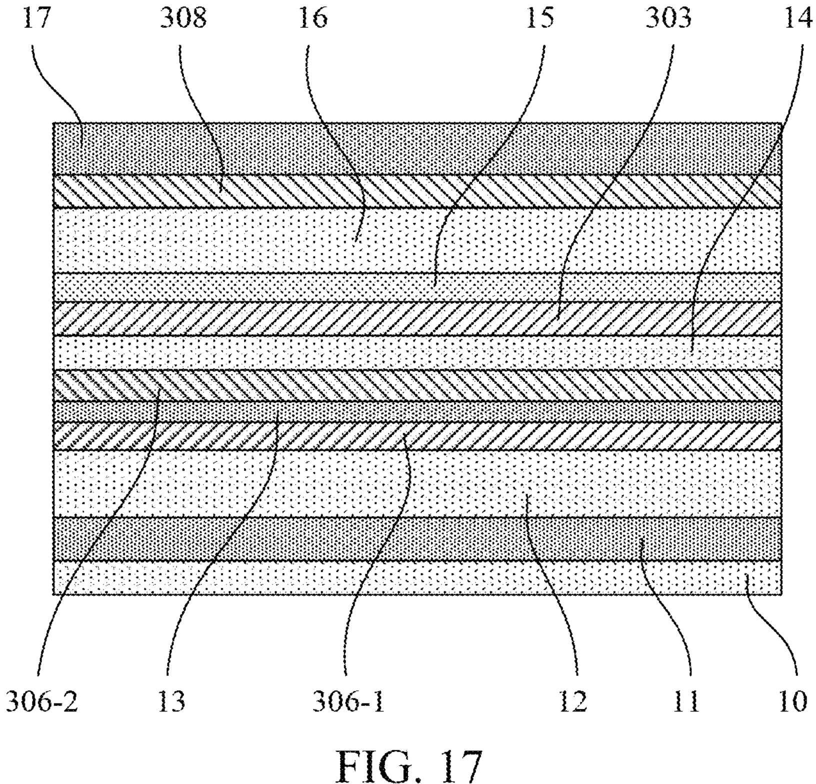
FIG. 17 is another schematic cross-sectional view of a selection connection line region according to an exemplary embodiment of the present disclosure.

FIG. 17 is a schematic cross-sectional view of a selection connection line region according to an exemplary embodiment of the present disclosure, which is a cross-sectional view taken along line B-B in FIG. 2. As shown in FIG. 17, in a plane perpendicular to the display substrate, the selection connection line region 206 of the binding region includes: a first insulating layer 11 and a second insulating layer 12 stacked on a substrate 10, a plurality of first selection connection lines 306-1 disposed on the second insulating layer 12, a third insulating layer 13 disposed on the first selection connection lines 306-1, a plurality of second selection connection line 306-2 disposed on the third insulating layer 13, a fourth insulating layer 14 disposed on the second selection connection lines 306-2, a shielding panel 303 disposed on the fourth insulating layer 14, a fifth insulating layer 15 and a first planarization layer 16 disposed on the shielding panel 303, a plurality of third signal connection lines 308 disposed on the first planarization layer 16, and a second planarization layer 17 disposed on the third signal connection lines 308.

In an exemplary embodiment, the selection connection line region 206 further includes at least two first shielding lines disposed in the same layer as the first selection connection lines 306-1, and the at least two first shielding lines are disposed on both sides of a plurality of first selection connection lines 306-1.

In an exemplary embodiment, the selection connection line region 206 further includes at least two second shielding lines disposed in the same layer as the second selection connection lines 306-2, and the at least two second shielding lines are disposed on both sides of a plurality of second selection connection lines 306-2.

In an exemplary embodiment, the first selection connection lines 306-1 are disposed on the same layer as the first gate metal layer of the display region 100, and are simultaneously formed by the same patterning process; the second selection connection lines 306-2 are disposed on the same layer as the second gate metal layer of the display region 100, and are simultaneously formed by the same patterning process; the shielding panel 303 is disposed on the same layer as the first source-drain metal layer of the display region 100, and are simultaneously formed by the same patterning process; the third signal connection lines 308 are disposed on the same layer as the second source-drain metal layer of the display region 100, and are simultaneously formed by the same patterning process.

In an exemplary embodiment, a driver chip signal line is formed in the driver chip region 204 of the binding region, and a circuit board signal line is formed in the circuit board region of the binding region. The driver chip signal line and the circuit board signal line are disposed on the same layer as the shielding panel 303, and are simultaneously formed by the same patterning process. The driver chip signal line has an end away from the selection connection line region 206 and connected with the source driver circuit, and an end adjacent to the selection connection line region 206 and connected with the first end of the third signal connection line 308 through a via. The circuit board signal line has an end away from the selection connection line region 206 and connected with the flexible printed circuit, and an end adjacent to the selection connection line region 206 and connected with the second end of the third signal connection line 308 through a via. The third signal connection line 308 forms a single signal connection line structure connecting the driver chip signal line and the circuit board signal line.

In an exemplary embodiment, a plurality of first selection connection lines 306-1 and a plurality of second selection connection lines 306-2 are configured to establish connections between a plurality of input ports of the first selector circuit 210 and a plurality of input ports of the second selector circuit 220. For any one of the first selection connection lines 306-1, one end of the first selection connection line 306-1 is connected to the input port of the first selector circuit, and the other end is connected to the input port of the second selector circuit. For any one of the second selection connection lines 306-2, one end of the second selection connection line 306-2 is connected to the input port of the first selector circuit, and the other end is connected to the input port of the second selector circuit.

In an exemplary embodiment, the first selection connection line 306-1 and the second selection connection line 306-2 can be connected to different input ports, and the plurality of selection connection lines are respectively disposed on two layers, so that the width of the selection connection line region 206 can be reduced.

In an exemplary embodiment, the first selection connection line 306-1 and the second selection connection line 306-2 can be connected to the same input port, and the plurality of selection connection lines of two layers can form a double selection connection line structure, which not only reduces the connection resistance, but also ensures the reliability of signal transmission.

The present disclosure also provides a preparation method of a display substrate, which includes a display region and a binding region located at one side of the display region. In an example embodiment, the preparation method includes: forming a source driver circuit, a flexible printed circuit board, a first selector circuit, a second selector circuit and a plurality of selection connection lines in the binding region; for at least one selection connection line of the plurality of selection connection lines, one end of the selection connection line is connected to an input port of the first selector circuit, and the other end is connected to an input port of the second selector circuit; the flexible printed circuit board is disposed on one side, away from the display region, of the source driver circuit, and the plurality of selection connection lines are disposed between the source driver circuit and the flexible printed circuit board.

In an exemplary embodiment, the forming a source driver circuit, a flexible printed circuit board, a first selector circuit, a second selector circuit and a plurality of selection connection lines in the binding region, including: forming a first insulating layer and a second insulating layer on a substrate; forming a first signal connection line on the second insulating layer; forming a third insulating layer and a fourth insulating layer covering the first signal connection line and provided with two first vias exposing the first signal connection line; forming a driver chip signal line and a circuit board signal line on the fourth insulating layer, wherein one end of the driver chip signal line is connected with the source driver circuit, and the other end of the driver chip signal line is connected with an end of the first signal connection line through a first via, one end of the circuit board signal line is connected with the flexible printed circuit board, and the other end of the circuit board signal line is connected with the other end of the first signal connection line through a first via, forming a composite insulating layer covering the driver chip signal line and the circuit board signal line; and forming a plurality of selection connection lines on the composite insulating layer.

In an exemplary embodiment, the forming a source driver circuit, a flexible printed circuit board, a first selector circuit, a second selector circuit and a plurality of selection connection lines in the binding region, including: forming a first insulating layer, a second insulating layer and a third insulating layer on a substrate; forming a second signal connection line on the third insulating layer; forming a fourth insulating layer covering the second signal connection line and provided with two second vias exposing the second signal connection line; forming a driver chip signal line and a circuit board signal line on the fourth insulating layer, wherein one end of the driver chip signal line is connected with the source driver circuit, the other end of the driver chip signal line is connected with an end of the second signal connection line through a second via, one end of the circuit board signal line is connected with the flexible printed circuit board, and the other end of the circuit board signal line is connected with the other end of the second signal connection line through a second via; forming a composite insulating layer covering the driver chip signal line and the circuit board signal line; and forming a plurality of selection connection lines on the composite insulating layer.

In an exemplary embodiment, the forming a source driver circuit, a flexible printed circuit board, a first selector circuit, a second selector circuit and a plurality of selection connection lines in the binding region, including: forming a first insulating layer and a second insulating layer on a substrate; forming a first signal connection line on the second insulating layer; forming a third insulating layer covering the first signal connection line; forming a second signal connection line on the third insulating layer; forming a fourth insulating layer covering the second signal connection line and provided with two first vias exposing the first signal connection line and two second vias exposing the second signal connection line; forming a driver chip signal line and a circuit board signal line on the fourth insulating layer, wherein one end of the driver chip signal line is connected with the source driver circuit, the other end of the driver chip signal line is respectively connected with one end of the first signal connection line and one end of a second connection line through a first via and a second via, one end of the circuit board signal line is connected with the flexible printed circuit board, and the other end of the circuit board signal line is connected with the other end of the first signal connection line and the other end of the second signal connection line through a first via and a second via; forming a composite insulating layer covering the driver chip signal line and the circuit board signal line; and forming a plurality of selection connection lines on the composite insulating layer.

In an exemplary embodiment, the forming a plurality of selection connection lines on the composite insulating layer includes: forming the plurality of selection connection lines and at least two shielding lines on the composite insulating layer, wherein the at least two shielding lines are respectively disposed at both sides of the plurality of selection connection lines, and the width of the orthographic projection of the shielding line on the substrate is greater than that of the orthographic projection of the selection connection line on the substrate.

In an exemplary embodiment, the forming a driver chip signal line and a circuit board signal line on the fourth insulating layer includes: forming a shielding panel, the driver chip signal line and the circuit board signal line on the fourth insulating layer, wherein the shielding panel is disposed between the driver chip signal line and circuit board signal line, and the boundary of the orthographic projection of the plurality of selection connection lines on the substrate is located within the boundary range of the orthographic projection of the shielding panel on the substrate.

In an exemplary embodiment, the preparation method further includes: forming a first insulating layer, an active layer, a second insulating layer, a first gate metal layer, a third insulating layer, a second gate metal layer, a fourth insulating layer, a first source-drain metal layer, a composite insulating layer and a second source-drain metal layer in the display region.

In an exemplary embodiment, the first signal connection line and the first gate metal layer are disposed on the same layer, and are formed by the same patterning process.

In an exemplary embodiment, the second signal connection line and the second gate metal layer are disposed on the same layer, and are formed by the same patterning process.

In an exemplary embodiment, the driver chip signal line and the circuit board signal line are disposed on the same layer as the first source-drain metal layer, and are formed by the same patterning process.

In an exemplary embodiment, a plurality of selection connection lines are disposed on the same layer as the second source-drain metal layer, and are formed by the same patterning process.

The present disclosure further provides a display apparatus including the display substrate in aforementioned embodiments. The display apparatus may be any product or component with a display function, such as a mobile phone, a tablet computer, a television, a display, a notebook computer, a digital photo frame, a navigator, etc.

The accompanying drawings of the present application only refer to structures involved in the present disclosure, and other structures may refer to general designs. Without conflict, the embodiments of the present disclosure, i.e., the features in the embodiments may be combined with each other to obtain a new embodiment.

Those of ordinary skills in the art will appreciate that modifications or equivalent substitutions may be made to the technical solutions of the present disclosure without departing from the spirit and scope of the technical solutions of the present disclosure, all of which should be contained within the scope of the claims of the present application.

The invention claimed is:

1. A display substrate, comprising a display region and a binding region located on one side of the display region, wherein:

the binding region comprises: a selector circuit region and a selection connection line region, wherein the selection connection line region comprises a plurality of selection connection lines; and the selector circuit region comprises a first selector circuit and a second selector circuit;

for at least one selection connection line of the plurality of selection connection lines, one end of the at least one selection connection line is connected to an input port of the first selector circuit, and the other end is connected to an input port of the second selector circuit;

a shielding panel is formed in the selection connection line region;

in a plane perpendicular to the display substrate, the binding region further comprises a binding structure layer disposed on a substrate;

the binding structure layer at least comprises a plurality of insulating layers and signal connection lines at least partially disposed between the plurality of insulating layers;

a first insulating layer and a second insulating layer of the plurality of insulating layers are disposed on the substrate;

a first signal connection line of the signal connection lines is disposed on the second insulating layer; and a third insulating layer and a fourth insulating layer of the plurality of insulating layers covers the first signal connection line and are provided with two first vias exposing the first signal connection line.

2. The display substrate of claim 1, wherein the binding region further comprises a source driver circuit, a flexible printed circuit board, wherein the flexible printed circuit board is disposed on one side, away from the display region, of the source driver circuit, and the plurality of selection connection lines are disposed between the source driver circuit and the flexible printed circuit board.

3. The display substrate of claim 2, wherein the first selector circuit and the second selector circuit are respectively disposed on both sides of the source driver circuit in a direction parallel to an edge of the display region; and the edge of the display region is an edge of the display region adjacent to one side of the binding region.

4. The display substrate of claim 3, wherein a plurality of selector pins are deposited on the flexible printed circuit board; the selector pins are disposed on both sides of the flexible printed circuit board along the direction parallel to the edge of the display region; and for at least one selector pin among the plurality of selector pins, the at least one selector pin is connected with the at least one selection connection line through a selection line, or is connected with the input port of the first selector circuit or the input port of the second selector circuit through a selection line.

5. The display substrate of claim 3, wherein the first selector circuit and the second selector circuit respectively comprises M input ports; N selection connection lines of the plurality of selection connection lines are correspondingly connected with N input ports of the first selector circuit and N input ports of the second selector circuit, and N is less or equal to M.

6. The display substrate of claim 1, wherein:

the binding region further comprises a source driver circuit and a flexible printed circuit board, a driver chip signal line and a circuit board signal line are disposed on the fourth insulating layer, wherein one end of the driver chip signal line is connected with the source driver circuit, and the other end of the driver chip signal line is connected with a first end of the first signal connection line through a first via of the two first vias; one end of the circuit board signal line is connected with the flexible printed circuit board, and the other end of the circuit board signal line is connected with a second end of the first signal connection line through another first via of the two first vias.

7. The display substrate of claim 6, wherein the shielding panel is disposed on the fourth insulating layer, the shielding panel is disposed between the driver chip signal line and the circuit board signal line, and along a direction away from the display region, a boundary of an orthographic projection of the plurality of selection connection lines on the substrate is located within a boundary range of an orthographic projection of the shielding panel on the substrate.

8. The display substrate of claim 6, wherein in the plane perpendicular to the display substrate, the display region comprises: the first insulating layer, an active layer, the second insulating layer, a first gate metal layer, the third insulating layer, a second gate metal layer, the fourth insulating layer, a first source-drain metal layer, a composite insulating layer and a second source-drain metal layer stacked on the substrate;

the first signal connection line is disposed on the same layer as the first gate metal layer;

a second signal connection line is disposed on the same layer as the second gate metal layer;

the driver chip signal line and the circuit board signal line are disposed on the same layer as the first source-drain metal layer; and the plurality of selection connection lines are disposed on the same layer as the second source-drain metal layer.

9. The display substrate of claim 6, wherein the driver chip signal line and the circuit board signal line are first power supply lines, or the driver chip signal line and the circuit board signal line are second power supply lines; the first power supply lines are configured to connect high-level power supply lines; and the second power supply lines are configured to connect low-level power supply lines.

10. The display substrate of claim 1, wherein:

the binding region further comprises a source driver circuit and a flexible printed circuit board; and the binding structure layer further comprises:

a second signal connection line disposed on the third insulating layer, the fourth insulating layer covers the second signal connection line and provided with two second vias exposing the second signal connection line; and the binding structure layer further comprises a driver chip signal line and a circuit board signal line, the driver chip signal line and the circuit board signal line are disposed on the fourth insulating layer, wherein one end of the driver chip signal line is connected with the source driver circuit, and the other end of the driver chip signal line is connected with a first end of the second signal connection line through a second via of the two second vias; one end of the circuit board signal line is connected with the flexible printed circuit board, and the other end of the circuit board signal line is connected with a second end of the second signal connection line through another second via of the two second vias.

11. The display substrate of claim 1, wherein:

the binding region further comprises a source driver circuit and a flexible printed circuit board; and the binding structure layer further comprises:

a second signal connection line, which is disposed on the third insulating layer;

the fourth insulating layer covers the second signal connection line and provided with the two first vias exposing the first signal connection line and two second vias exposing the second signal connection line; and the binding structure layer further comprises: a driver chip signal line and a circuit board signal line, the driver chip signal line and the circuit board signal line are disposed on the fourth insulating layer, wherein one end of the driver chip signal line is connected with the source driver circuit, and the other end of the driver chip signal line is connected with first ends of the first signal connection line and the second connection line through a first via of the two first vias and a second via of the two second vias; one end of the circuit board signal line is connected with the flexible printed circuit board, and the other end of the circuit board signal line is connected with second ends of the first signal connection line and the second signal connection line through another first via of the two first vias and another second via of the two second vias.

12. The display substrate of claim 11, wherein: at least one first via of the two first vias and at least one second via of the two second vias are formed in a driver chip region of the binding region, a distance between the second via and the selection connection line region is smaller than a distance between the first via and the selection connection line region.

13. The display substrate of claim 12, wherein: another first via of the two first vias and another second via of the two second vias are formed in a circuit board region in the binding region, and a distance between the other second via and the selection connection line region is smaller than a distance between the other first via and the selection connection line region.

14. The display substrate of claim 1, wherein in the plane perpendicular to the display substrate, the binding region further comprises:

a composite insulating layer disposed on the binding structure layer, wherein:

the plurality of selection connection lines are disposed on the composite insulating layer; the composite insulating layer is further provided with at least two shielding lines;

the at least two shielding lines are respectively disposed on one side adjacent to the display region and one side away from the display region of the plurality of selection connection lines; and along a direction away from the display region, a width of an orthographic projection of at least one shielding line of the two shielding lines on the substrate is greater than that of an orthographic projection of the at least one selection connection line on the substrate.

15. The display substrate of claim 1, wherein:

in the plane perpendicular to the display substrate, the binding region further comprises:

a composite insulating layer disposed on the binding structure layer, wherein the composite insulating layer is further provided with at least two shielding lines, a boundary of an orthogonal projection of the at least two shielding lines on the substrate is located within a boundary range of an orthogonal projection of the shielding panel on the substrate.

16. The display substrate of claim 1, wherein in the plane perpendicular to the display substrate, the binding region further comprises:

a plurality of first selection connection lines and at least two first shielding lines disposed on the second insulating layer, wherein the at least two first shielding lines are respectively disposed on both sides of the plurality of first selection connection lines;

the third insulating layer covering the first selection connection lines and the at least two first shielding lines;

a plurality of second selection connection lines and at least two second shielding lines disposed on the third insulating layer, wherein the at least two second shielding lines are respectively disposed on both sides of the plurality of second selection connection lines;

the fourth insulating layer covering the second selection connection lines and at least two second shielding lines;

the shielding panel disposed on the fourth insulating layer, wherein a boundary of an orthographic projection of the plurality of first selection connection lines or the plurality of second selection connection lines on the substrate is located within a boundary range of an orthographic projection of the shielding panel on the substrate;

a composite insulating layer disposed on the shielding panel; and a plurality of third signal connection lines disposed on the composite insulating layer.

17. The display substrate of claim 16, wherein in the plane perpendicular to the display substrate, the display region comprises: the first insulating layer, an active layer, the second insulating layer, a first gate metal layer, the third insulating layer, a second gate metal layer, the fourth insulating layer, a first source-drain metal layer, the composite insulating layer and a second source-drain metal layer stacked on the substrate;

the first selection connection lines are disposed on the same layer as the first gate metal layer;

the second selection connection lines are disposed on the same layer as the second gate metal layer; and the shielding panel is disposed on the same layer as the first source-drain metal layer; and the third signal connection line is disposed on the same layer as the second source-drain metal layer.

18. The display substrate of claim 16, wherein: at least one first selection connection line of the plurality of first selection connection lines and at least one second selection connection line of the plurality of second selection connection lines are connected to a same input port.

19. A display apparatus, comprising the display substrate of claim 1.

* * * * *